United States Patent
Yamazaki et al.

(10) Patent No.: US 9,202,925 B2
(45) Date of Patent: Dec. 1, 2015

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Hideomi Suzawa, Kanagawa (JP); Yutaka Okazaki, Kanagawa (JP); Hidekazu Miyairi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 7 days.

(21) Appl. No.: 14/278,234

(22) Filed: May 15, 2014

(65) Prior Publication Data
US 2014/0339546 A1  Nov. 20, 2014

(30) Foreign Application Priority Data

May 20, 2013 (JP) ................. 2013-106223
May 20, 2013 (JP) ................. 2013-106253

(51) Int. Cl.
*H01L 29/10* (2006.01)
*H01L 29/786* (2006.01)
*H01L 21/822* (2006.01)
(Continued)

(52) U.S. Cl.
CPC ........ *H01L 29/7869* (2013.01); *H01L 21/8221* (2013.01); *H01L 27/0688* (2013.01); *H01L 29/42384* (2013.01); *H01L 29/78603* (2013.01); *H01L 29/78606* (2013.01); *H01L 29/78696* (2013.01)

(58) Field of Classification Search
None
See application file for complete search history.

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

EP  1737044 A  12/2006
EP  2226847 A  9/2010
(Continued)

OTHER PUBLICATIONS

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

(Continued)

*Primary Examiner* — Fei Fei Yeung Lopez
(74) *Attorney, Agent, or Firm* — Fish & Richardson P.C.

(57) ABSTRACT

A structure is employed in which a first protective insulating layer; an oxide semiconductor layer over the first protective insulating layer; a source electrode and a drain electrode that are electrically connected to the oxide semiconductor layer; a gate insulating layer that is over the source electrode and the drain electrode and overlaps with the oxide semiconductor layer; a gate electrode that overlaps with the oxide semiconductor layer with the gate insulating layer provided therebetween; and a second protective insulating layer that covers the source electrode, the drain electrode, and the gate electrode are included. Furthermore, the first protective insulating layer and the second protective insulating layer each include an aluminum oxide film that includes an oxygen-excess region, and are in contact with each other in a region where the source electrode, the drain electrode, and the gate electrode are not provided.

17 Claims, 29 Drawing Sheets

(51) Int. Cl.
*H01L 27/06* (2006.01)
*H01L 29/423* (2006.01)

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,384,080 | B2 | 2/2013 | Taniguchi et al. |
| 8,502,216 | B2 | 8/2013 | Akimoto |
| 8,541,266 | B2 | 9/2013 | Yamazaki |
| 8,692,252 | B2 | 4/2014 | Takata et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0127523 | A1* | 6/2011 | Yamazaki ................ 257/43 |
| 2011/0309431 | A1 | 12/2011 | Takemura |
| 2011/0312127 | A1 | 12/2011 | Ishizuka et al. |
| 2013/0009148 | A1 | 1/2013 | Yamazaki |
| 2014/0339538 | A1 | 11/2014 | Yamazaki et al. |
| 2014/0339548 | A1 | 11/2014 | Yamazaki et al. |
| 2014/0339549 | A1 | 11/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 63-210023 A | 8/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-124360 A | 6/2011 |
| JP | 2011-138934 A | 7/2011 |
| WO | WO-2004/114391 | 12/2004 |

OTHER PUBLICATIONS

Kitzerow.H et al., "Observation of Blue Phases in Chiral Networks", Liquid Crystals, 1993, vol. 14, No. 3, pp. 911-916.

Nakamura.M, "Synthesis of Homologous Compound with New Long-Period Structure", NIRIM Newsletter, Mar. 1, 1995, vol. 150, pp. 1-4.

Fung.T et al., "2-D Numerical Simuiation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(56) References Cited

OTHER PUBLICATIONS

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1260-1272.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1905.

Van de Walle.C, "Hydrogens as a Cause of Doping in Zinc Oxide", Phys. Rev. Lett. (Physical Review Letters), Jul. 31, 2000, vol. 85, No. 5, pp. 1012-1015.

Kurokawa.Y et al., "UHF RFCPUS on Flexible and Glass Substrates for Secure RFID Systems", Journal of Solid-State Circuits, 2008, vol. 43, No. 1, pp. 292-299.

Chern.H et al. "An Analytical Model for the Above-Threshold Characteristics of Polysilicon Thin-Film Transistors", IEEE Transactions on Electron Devices, Jul. 1, 1995, vol. 42 No. 7, pp. 1240-1246.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B; Mg, Mn, Fe, Ni, Cu,or Zn] At Temperatures Over 1000° C", Journal of Solid State Chemistry, 1985, vol. 60, pp. 382-384.

Costello.M et al., "Electron Microscopy of a Cholesteric Liquid Crystal and Its Blue Phase", Phys. Rev. A (Physical Review. A), May 1, 1984, vol. 29, No. 5 pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Janotti.A et al., "Native Point Defects in ZnO", Phys. Rev. B (Physical Revew B), Oct. 4, 2007, vol. 76, No. 16. pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Janotti.A et al., "Oxygen Vacancies in ZnO", Appl. Phys. Lett. (Applied Physics Letters) 2005, vol. 87, pp. 122102-1-122102-3.

Oba.F et al., "Defect energetics in ZnO: A hybrid Hartree-Fock density functional study", Phys. Rev. B.(Physical Review. B), 2008, vol. 77, pp. 245202-1-245202-6.

Lany.S et al., "Dopability, Intrinsic Conductivity, and Nonstolchiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol B (Journal of Vacuum Science & Technology B), Mar. 1, 2003, vol. 21, No, 2, pp. 800-803.

Oh.M et al., "Improving The Gate Stability of ZnO Thin-Film Transistors With Aluminum Oxide Dielectric Layer", J. Electrochem. Soc. (Journal of the Electrochemical Society), 2008, vol. 155, No, 12, pp. H1009-H1014.

Ueno.K et al., "Field-Effect Transistor on SrTiO3 With Sputtered Al2O3 Gate Insulator", Appl. Phys. Left. (Applied Physics Letters), Sep. 1, 2003, vol. 83, No. 9, pp. 1755-1757.

Dembo. H et al., "RFCPUS on Glass and Plastic Substrates Fabricated by TFT Transfer Technology", IEDM 05: Technical Digest of International Electron Devices Meeting, Dec. 5, 2005. pp. 1067-1069.

Ikeda. T et al., "Full-Functional System Liquid Crystal Display Using CG-Silicon Technology", SID Digest '04 : SID International Symposium Digest of Technical Papers, 2004, vol. 35, pp. 860-863.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Son.K et al., "42.4L: LA1E-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '03 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1. pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Jen.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-935.

Hosono.H, "68.3:Invited Paper:Transparent Amorphous Oxide Semiconductors for High Performance TFT", SID Digest '07 : SID International Symposium Digest of Technical Papers, 2007; vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009. pp. 1110-1112.

Ohara.H et al., "21.3:4.0 In QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009. pp. 395-398.

Kikuchi.H et al., "62.2:Invited Paper:Fast Electro-Optical Switching in Polymer-Stabilezed Liquid Crystalline Blue Phases for Display Application", SID Digest '07 : SID International Symposium Digest of Technical Papers, 2007, vol. 38, pp. 1737-1740.

(56) References Cited

OTHER PUBLICATIONS

Park.Sang-Hee et al., "42.3: Transparent ZnO Thin Film Transistor for the Application of High Aperture Ratio Bottom Emission AMOLED Display", SID Digest '08 : SID International Symposium Digest of Technical Papers, May 20, 2008, vol. 39, pp. 629-632.

Hsieh.H et al., "P-29:Modeling of Amorphous Oxide Semiconductor Thin Film Transistors and Subgap Density of States", SID Digest '03 : SID International Symposium Digest of Technical Papers, May 20, 2008, vol. 39, pp. 1277-1280.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 131-184.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Kikuchi.H et al., "Polymer-Stabilized Liquid Crystal Blue Phases", Nature Materials, Sep. 2, 2002, vol. 1, pp. 64-68.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Orita.M et al., "Amorphous transparent conductive oxide InG2O3(ZnO)m (m <4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Clark.S et al., "First Principles Methods Using CASTEP", Zeitschrift fur Kristallographie 2005, vol. 220, pp. 567-570.

Takahashi.M et al., "Theoretical Analysis of IGZO Transparent Amorphous Oxide Semiconductor", IDW '08 : Proceedings of the 15th International Display Workshops, Dec. 3, 2008. pp. 1637-1640.

Tsuda.K et al., "Ultra Low Power Consumption Technologies for Mobile TFT-LCDs ", IDW'02 : Proceedings of the 9th International Display Workshops, Dec. 4, 2002, pp. 295-298.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-273.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Lee.H et al., "Current Status of, Challenges to, and Perspective View of AM-OLED", IDW '06 : Proceedings of the 13th International Display Workshops, Dec. 7, 2006, pp. 663-666.

Mo.Y et al., "Amorphous Oxide TFT Backplanes for Large Size AMOLED Displays", IDW '08 ' Proceedings of the 6th International Display Workshops, Dec. 3, 2008. pp. 531-584.

Kim.S et al., "High-Performance oxide thin film transistors passivated by various gas plasmas", 214th ECS Meeting, 2003, No. 2317, ECS.

* cited by examiner

A  101 111 103 102 106 104  105  112  B

C  101 111  104 106 102  105  112  D 101 111 103 102 104 105 112 124 125 120

201 207 203 202 211 204 205 206 212

201 207 206 202 211 204 205 212

201 207 203 202 211 205 204 212 224 225 220

150

A 101 111 103 102 151 104 152 105 112 B

C 101 111 104 151 152 102 105 112 D

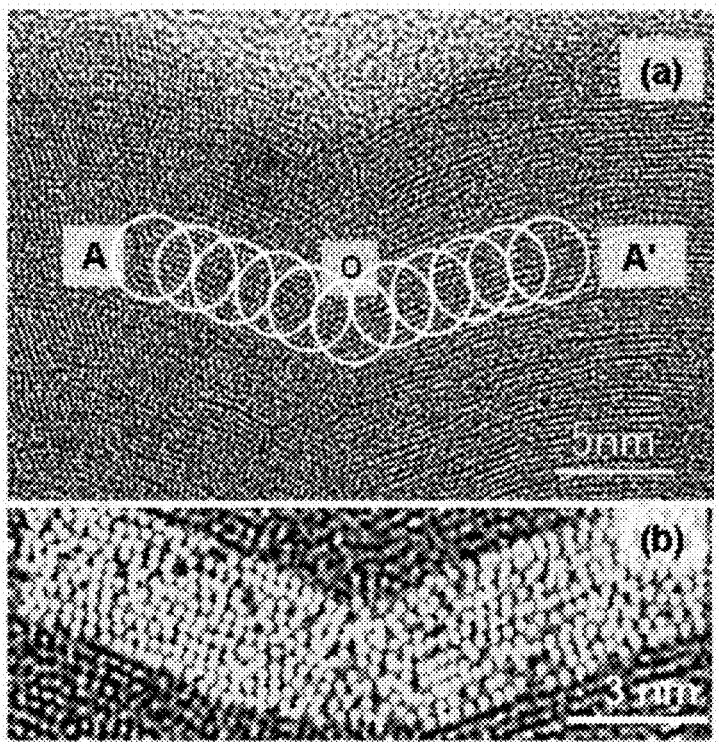
FIG. 23A
FIG. 23B
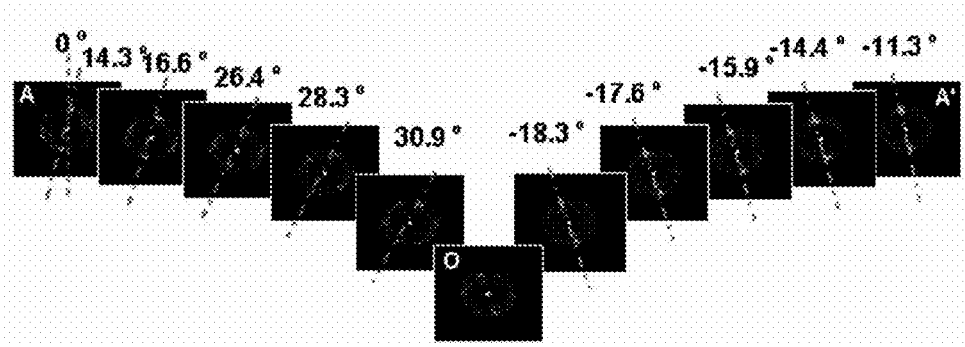
FIG. 23C

CAAC-OS nc-OS as-sputtered    after 450°C heat treatment

☐ Proportion of non-CAAC    ☰ Proportion of CAAC as-sputtered after 450°C heat treatment 101 111 103 102 104 105 112

101 111 104 102 105 112

160

A  101 111 103 102 151 104 152 105         112  B

C  101 111    104 151 152 102  105      112  D

SEMICONDUCTOR DEVICE

BACKGROUND OF THE INVENTION

1. Field of the Invention

The invention disclosed in this specification and the like relates to a semiconductor device and a method for manufacturing the semiconductor device.

In this specification and the like, a semiconductor device means all types of devices that can function by utilizing semiconductor characteristics. A transistor, a semiconductor circuit, an arithmetic unit, a memory device, an imaging device, an electro-optical device, a power generation device (e.g., a thin film solar cell and an organic thin film solar cell), and an electronic device are each an embodiment of the semiconductor device.

2. Description of the Related Art

Attention has been focused on a technique for formation of a transistor using a semiconductor thin film formed over a substrate having an insulating surface. The transistor is applied to a wide range of electronic devices such as an integrated circuit (IC) or an image display device (also simply referred to as a display device). A silicon-based semiconductor material is widely known as a material for a semiconductor thin film applicable to a transistor. As another material, an oxide semiconductor has been attracting attention.

For example, a technique for formation of a transistor using zinc oxide or an In—Ga—Zn-based oxide semiconductor as an oxide semiconductor is disclosed (see Patent Documents 1 and 2).

In addition, a technique in which oxide semiconductor layers with different electron affinities (or conduction band minimum states) are stacked to increase the carrier mobility of a transistor is disclosed (see Patent Documents 3 and 4).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-124360
[Patent Document 4] Japanese Published Patent Application No. 2011-138934

SUMMARY OF THE INVENTION

Improvement in reliability is important for commercialization of semiconductor devices including transistors that use an oxide semiconductor. Variation and decrease in electrical characteristics of a semiconductor device are particularly a factor of reduction in the reliability thereof.

In view of the above problem, an object of one embodiment of the present invention is to provide a semiconductor device using an oxide semiconductor and having high reliability.

Miniaturization of a transistor is necessary for high-speed operation, low power consumption, price reduction, high integration, or the like of the transistor.

Thus, another object of one embodiment of the present invention is to provide a semiconductor device using an oxide semiconductor that is miniaturized and has favorable electrical characteristics.

Note that the descriptions of these objects do not disturb the existence of other objects. Note that in one embodiment of the present invention, there is no need to achieve all the objects. Objects other than the above objects will be apparent from and can be derived from the description of the specification and the like.

A semiconductor device of one embodiment of the present invention includes a first protective insulating layer; an oxide semiconductor layer over the first protective insulating layer; a source electrode and a drain electrode that are electrically connected to the oxide semiconductor layer; a gate insulating layer that is over the source electrode and the drain electrode and overlaps with the oxide semiconductor layer; a gate electrode that overlaps with the oxide semiconductor layer with the gate insulating layer provided therebetween; and a second protective insulating layer that covers the source electrode, the drain electrode, and the gate electrode. The first protective insulating layer and the second protective insulating layer each include an aluminum oxide film that includes an oxygen-excess region, and are in contact with each other in a region where the source electrode, the drain electrode, and the gate electrode are not provided.

The gate electrode preferably covers a top surface and side surfaces of the oxide semiconductor layer with the gate insulating layer provided therebetween.

The thickness of the oxide semiconductor layer is preferably 0.1 times or more and 10 times or less as large as the channel width.

The semiconductor device may further include a first oxide layer that is between the first protective insulating layer and the oxide semiconductor layer and contains at least one metal element contained in the oxide semiconductor layer, and a second oxide layer that is between the oxide semiconductor layer and the gate insulating layer and contains at least one metal element contained in the oxide semiconductor layer. Here, a conduction band minimum of the first oxide layer and a conduction band minimum of the second oxide layer are each closer to a vacuum level than a conduction band minimum of the oxide semiconductor layer. A difference between energy at the conduction band minimum of the first oxide layer and energy at the conduction band minimum of the oxide semiconductor layer is 0.05 eV or higher and 2 eV or lower. A difference between energy at the conduction band minimum of the second oxide layer and the energy at the conduction band minimum of the oxide semiconductor layer is 0.05 eV or higher and 2 eV or lower.

A top surface of the second oxide layer may be in contact with an undersurface of the source electrode, an undersurface of the drain electrode, and an undersurface of the gate insulating layer.

Alternatively, an undersurface of the second oxide layer may be in contact with a top surface of the source electrode, a top surface of the drain electrode, and a top surface and side surfaces of the oxide semiconductor layer in a region where the source electrode and the drain electrode are not provided.

A semiconductor device of another embodiment of the present invention includes an insulating layer including a groove; a first protective insulating layer that covers a side surface and a bottom surface of the groove; an oxide semiconductor layer that is over the first protective insulating layer and fills the groove; a source electrode and a drain electrode that are electrically connected to the oxide semiconductor layer; a gate insulating layer that is over the source electrode and the drain electrode and overlaps with the oxide semiconductor layer; a gate electrode that overlaps with the oxide semiconductor layer with the gate insulating layer provided therebetween; and a second protective insulating layer that covers the source electrode, the drain electrode, and the gate electrode. Furthermore, the first protective insulating layer and the second protective insulating layer each include an aluminum oxide film that includes an oxygen-excess region, and are in contact with each other in a region where the source electrode, the drain electrode, and the gate electrode are not provided.

One embodiment of the present invention makes it possible to provide a semiconductor device using an oxide semiconductor and having high reliability.

One embodiment of the present invention makes it possible to provide a semiconductor device using an oxide semiconductor that is miniaturized and has favorable electrical characteristics.

BRIEF DESCRIPTION OF THE DRAWINGS

FIGS. 23A to 23C are cross-sectional TEM images and a local Fourier transform image of an oxide semiconductor.

DETAILED DESCRIPTION OF THE INVENTION

Figure 1A:
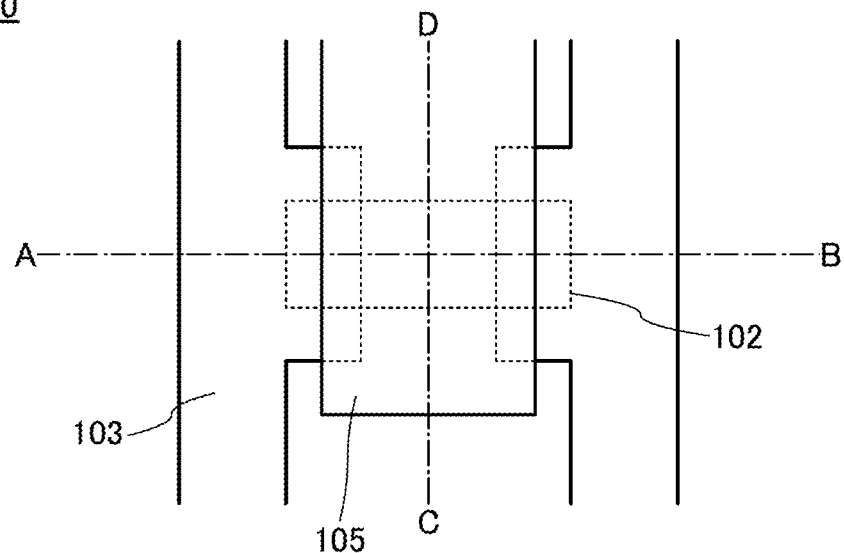
FIGS. 1A to 1C illustrate a structural example of a semiconductor device of an embodiment.

Embodiments will be described in detail with reference to drawings. Note that the present invention is not limited to the description below, and it is easily understood by those skilled in the art that the mode and details can be changed in various ways without departing from the spirit and scope of the present invention. Therefore, the present invention should not be interpreted as being limited to the following description of the embodiments.

Note that in the structures of the invention described below, the same portions or portions having similar functions are denoted by the same reference numerals in different drawings, and description of such portions is not repeated. The same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Embodiment 1

In this embodiment, a structure and a manufacturing method of a transistor, which is an example of a semiconductor device of one embodiment of the present invention, are described with reference to drawings.

In the case of manufacturing a transistor using an oxide semiconductor, an oxygen vacancy can be given as a carrier supply source of the oxide semiconductor. A large number of oxygen vacancies in an oxide semiconductor including a channel formation region of a transistor lead to generation of electrons in the channel formation region, which causes defects in electrical characteristics; for example, the transistor becomes normally-on, leakage current increases, or threshold voltage is shifted due to stress application.

In an oxide semiconductor layer, hydrogen, silicon, nitrogen, carbon, and metal elements which are not the main components are impurities. For example, some hydrogen forms a donor level in the oxide semiconductor layer, which results in an increase in carrier density.

For these reasons, to obtain stable electrical characteristics of a semiconductor device using an oxide semiconductor, some measures need to be taken to reduce oxygen vacancies by supplying an adequate amount of oxygen to the oxide semiconductor layer and to reduce the concentrations of impurities such as hydrogen.

In view of the above, in a semiconductor device of one embodiment of the present invention, a protective insulating layer including an aluminum oxide film with an oxygen-excess region is provided to surround an oxide semiconductor layer, so that oxygen is supplied from the protective insulating layer to a channel formation region; thus, oxygen vacancies that might be formed in the channel formation region are filled. Furthermore, the protective insulating layer inhibits release of oxygen from the oxide semiconductor layer, which makes it possible to inhibit formation of oxygen vacancies.

In one embodiment of the present invention, an insulating layer including an aluminum oxide film that contains excess oxygen is used as a protective insulating layer for supplying oxygen to a channel formation region. Here, the term "excess oxygen" refers to, for example, oxygen contained in excess of the stoichiometric composition or oxygen that might be released by heating at a temperature lower than or equal to that applied in the manufacturing process of a semiconductor device. As the aluminum oxide film containing excess oxygen, an AlOx (x is greater than 3/2) film can be used, for example. Excess oxygen contained in the aluminum oxide film can be released by heating and supplied to an oxide semiconductor layer. Therefore, by providing an insulating layer including the aluminum oxide film over and under the oxide semiconductor layer, oxygen can be effectively supplied to the channel formation region.

Note that the aluminum oxide film containing excess oxygen can be formed by a sputtering method or the like in an atmosphere containing oxygen, for example.

The aluminum oxide film is an insulating layer that is less permeable to oxygen and hydrogen than an insulating layer such as a silicon oxide film or a silicon oxynitride film or the oxide semiconductor layer is. In other words, the aluminum oxide film is an insulating layer with a barrier property to oxygen and hydrogen. Thus, with an insulating layer including the aluminum oxide film, oxygen vacancies formed due to release of oxygen can be reduced in a region surrounded by the insulating layer and mixing of hydrogen or a hydrogen compound into the region can be inhibited.

In one embodiment of the present invention, in a region where the oxide semiconductor layer and source and drain electrodes electrically connected to the oxide semiconductor layer are not provided, protective insulating layers provided over and under the oxide semiconductor layer are in contact with each other. That is, in the semiconductor device of one embodiment of the present invention, aluminum oxide films are provided to wrap the oxide semiconductor layer. Such a structure makes it possible to supply oxygen and to reduce mixing of impurities such as hydrogen and/or release of oxygen into/from a side surface of the oxide semiconductor layer in addition to interfaces with the oxide semiconductor layer on the front channel side and the back channel side. Consequently, a change in the electrical characteristics of a transistor in which a channel is formed in the oxide semiconductor layer is suppressed, which enables a semiconductor device to have high reliability.

By reducing oxygen vacancies in the channel formation region, the semiconductor device of one embodiment of the present invention can have favorable electrical characteristics and can be a highly reliable semiconductor device in which a change in the electrical characteristics is suppressed.

Effects of a structure of one embodiment of the present invention can be described, for example, as follow.

In a semiconductor device of one embodiment of the present invention, insulating layers each including an aluminum oxide film that contains excess oxygen are provided to wrap an oxide semiconductor layer. The excess oxygen contained in the aluminum oxide film is supplied to the oxide semiconductor layer including a channel through heat treatment in the manufacturing process of the semiconductor device. In addition, since the aluminum oxide film has a barrier property to oxygen and hydrogen, release of oxygen from the oxide semiconductor layer wrapped with the insulating layers each including the aluminum oxide film and mixing of impurities such as hydrogen into the oxide semiconductor layer can be reduced. An oxide semiconductor layer which is supplied with an adequate amount of oxygen and into which impurities such as hydrogen are inhibited from being mixed is a highly purified intrinsic oxide semiconductor layer.

Furthermore, in the semiconductor device, a gate electrode overlapping with the oxide semiconductor layer with a gate insulating layer provided therebetween is preferably provided to overlap with side surfaces and a top surface of the channel formation region in the oxide semiconductor layer. With such a structure, an electric field is applied to the oxide semiconductor layer in a direction perpendicular to the side surfaces and a direction perpendicular to the top surface, which makes it possible to favorably control the threshold voltage of the transistor and improve the subthreshold swing (also referred to as S value) thereof.

Miniaturization of a transistor is necessary for a semiconductor device to have high density (a high degree of integration). On the other hand, it is known that miniaturization of a transistor might cause deterioration of the electrical characteristics of the transistor.

For example, it is known that a transistor using silicon with a short channel length produces short-channel effects such as deterioration of the subthreshold swing (S value) and a shift in the threshold voltage.

In contrast, in a transistor using an oxide semiconductor that is an accumulation transistor in which electrons are majority carriers, drain-induced barrier lowering (DIBL) in a short channel is less likely to occur than in an inversion transistor such as the transistor using silicon. In other words, the transistor using an oxide semiconductor is resistant to a short-channel effect.

In addition, a transistor with a short channel width might reduce an on-state current. For the purpose of increasing the on-state current, there is a method in which the thickness of an active layer is increased so that a channel is formed on side surfaces of the active layer. However, an increase in a surface area where a channel is formed increases scattering of carriers at the interface between a channel formation region and a gate insulating layer; therefore, it is not easy to increase the on-state current sufficiently.

However, in the transistor of one embodiment of the present invention, the insulating layers each including the aluminum oxide film that contains excess oxygen are included to wrap the oxide semiconductor layer in which the channel is formed; thus, excess oxygen contained in the aluminum oxide film can be supplied to the oxide semiconductor layer and release of oxygen and mixing of impurities such as hydrogen from/into the oxide semiconductor layer can be reduced. Because an oxygen vacancy and hydrogen are factors in generating carriers in the oxide semiconductor layer, providing the aluminum oxide film containing excess oxygen can reduce scattering of carriers that might occur at an interface with the oxide semiconductor layer in which the channel is formed.

Accordingly, even when the channel width is decreased, an on-state current can be sufficiently increased by increasing the thickness of the oxide semiconductor layer to increase a surface area of the oxide semiconductor layer that overlaps with the gate electrode. To sufficiently apply an electric field from the gate electrode in the side surface direction of the oxide semiconductor layer, the thickness of the oxide semiconductor layer is preferably greater than or equal to the channel width.

Furthermore, it is effective to provide an oxide layer containing at least one metal element in the oxide semiconductor layer in contact with the oxide semiconductor layer, in which case the above-described scattering of carriers can be further reduced.

Note that when the channel length and channel width of the transistor are extremely small, end surfaces of a wiring, a semiconductor layer, and the like which are processed with the use of a resist mask are rounded (curved) in some cases. In the case of forming a thin insulating layer (e.g., gate insulating layer) to cover the oxide semiconductor layer with a large thickness, shape defects are caused by poor coverage with the insulating layer, so that stable electrical characteristics cannot be obtained in some cases. However, the oxide semiconductor layer with a curved end surface can increase the coverage with the insulating layer provided over the oxide semiconductor layer, which is preferable.

In addition, some hydrogen in the oxide semiconductor layer is trapped by oxygen vacancies and thus the oxide semiconductor layer has n-type conductivity; therefore, the Fermi level (Ef) gets near the conduction band minimum (Ec). Accordingly, with the oxide semiconductor layer containing a large amount of hydrogen, the electrical characteristics might be changed but an increase in the field-effect mobility of the transistor is expected. In the case where the oxide semiconductor layer is made intrinsic or substantially intrinsic, the Fermi energy of the oxide semiconductor layer is aligned with or gets near the mid gap (energy in the middle of the energy gap of the oxide semiconductor layer) as much as possible. In this case, the field-effect mobility might be reduced because of a decrease in the number of carriers contained in the oxide semiconductor layer.

However, in the transistor of one embodiment of the present invention, a gate electric field is applied to the oxide semiconductor layer in the side surface direction in addition to the perpendicular direction. That is, the gate electric field is applied entirely to the oxide semiconductor layer, so that current flows through the bulk of the oxide semiconductor layer. Consequently, a change in the electrical characteristics can be suppressed owing to the highly purified intrinsic oxide semiconductor layer and the field-effect mobility of the transistor can be increased.

More specifically, the following structures can be employed for example.

Structural Example 1

Figure 1B:
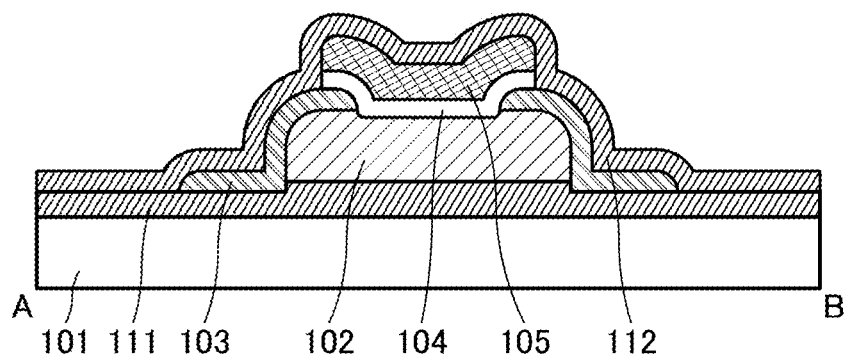
Figure 1C:
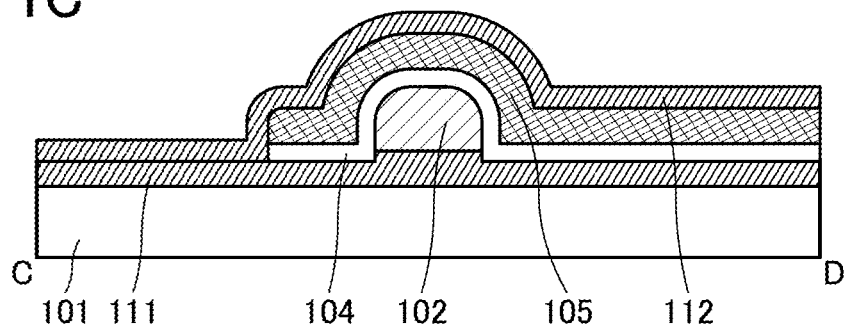

FIG. 1A is a schematic top view of a transistor 100 described as an example in this structural example. FIG. 1B is a schematic cross-sectional view taken along line A-B in FIG. 1A, and FIG. 1C is a schematic cross-sectional view taken along line C-D in FIG. 1A. Note that some components are not illustrated in FIG. 1A for clarification.

The transistor 100 is provided over a substrate 101 and includes an island-shaped semiconductor layer 102, a pair of electrodes 103 electrically connected to the semiconductor layer 102, a gate insulating layer 104 that is over the pair of electrodes 103 and overlaps with the semiconductor layer 102, and a gate electrode 105 that is over the gate insulating layer 104 and overlaps with the semiconductor layer 102.

A first protective insulating layer 111 is provided between the substrate 101 and the semiconductor layer 102. A second protective insulating layer 112 is provided over the pair of electrodes 103 and the gate electrode 105. Furthermore, the first protective insulating layer 111 and the second protective insulating layer 112 are in contact with each other in a region where the pair of electrodes 103 and the gate electrode 105 are not provided.

The semiconductor layer 102 contains an oxide semiconductor. The semiconductor layer 102 preferably contains at least indium (In) or zinc (Zn). Alternatively, the semiconductor layer 102 preferably contains both In and Zn, more preferably contains an In—M-Zn-based oxide (M is a metal such as Al, Ti, Ga, Ge, Y, Zr, Sn, La, Ce, or Hf).

The pair of electrodes 103 serves as a source electrode and a drain electrode of the transistor 100. In FIG. 1B, the pair of electrodes 103 is provided in contact with a top surface and side surfaces of the semiconductor layer 102.

The gate electrode 105 is provided to surround the top surface and the side surfaces of the semiconductor layer 102 with the gate insulating layer 104 provided therebetween.

Here, the channel length (L) of the transistor is a distance between the source and the drain which face each other. The channel width (W) of the transistor is the width of the semiconductor layer in a direction orthogonal to the channel length direction. Note that in the transistor, depending on the shapes of the source electrode, the drain electrode, the gate electrode, and the semiconductor layer, the channel length and the channel width are not uniform in some cases. In such a case, the average channel length or the minimum channel length can be used as the channel length of the transistor, and the average channel width or the minimum channel width can be used as the channel width of the transistor.

The gate electrode 105 is provided to surround the side surfaces of the semiconductor layer 102; therefore, the side surfaces of the semiconductor layer 102 can serve as a channel formation region. In this case, the thickness of the semiconductor layer 102 is preferably 0.05 times or more and 20 times or less, more preferably 0.1 times or more and 10 times or less as large as the channel width of the semiconductor layer 102. With such a shape, a decrease in an on-state current can be suppressed even when the channel width is reduced, resulting in a further miniaturized transistor capable of operating at high speed.

A structure of such a transistor in which a gate electrode is provided to surround a top surface and side surfaces of a semiconductor layer and a channel formed in the vicinity of the side surfaces of the semiconductor layer is actively used to increase an on-state current can be referred to as a surrounded channel (S-channel) structure.

Each of the first protective insulating layer 111 and the second protective insulating layer 112 can be formed using an insulating material including an oxygen-excess region and having a function of inhibiting diffusion of oxygen (also referred to as a property of blocking oxygen). For example, a layer including an aluminum oxide film can be used as the first protective insulating layer 111 and the second protective insulating layer 112. Alternatively, a film containing an insulating material that contains oxygen, such as aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used.

As the insulating film including the oxygen-excess region, an oxide insulating film containing oxygen in excess of the stoichiometric composition is preferably used, for example.

Some oxygen is released by heating from the oxide insulating film containing oxygen in excess of the stoichiometric composition.

It is preferable to use an insulating material having an extremely low hydrogen content for the first protective insulating layer 111 and the second protective insulating layer 112. For example, an insulating material including a region in which a hydrogen content measured by secondary ion mass spectrometry (SIMS) is less than $5 \times 10^{21}$ atoms/cm$^3$, preferably less than $2 \times 10^{21}$ atoms/cm$^3$, more preferably less than $1 \times 10^{21}$ atoms/cm$^3$ can be used.

Alternatively, a material in which silicon oxide is contained in any of the above-described oxides can be used as the insulating material for the first protective insulating layer 111 and the second protective insulating layer 112. For example, a material in which 0.1 wt % to 30 wt % (e.g., 5 wt % or 10 wt %) silicon oxide is contained in aluminum oxide can be used. The use of the material containing 0.1 wt % to 30 wt % silicon oxide can increase the amount of oxygen released from by heating without decreasing the property of blocking oxygen and can reduce the stress of a film.

[Components]

Components of the transistor 100 are described below.

[Semiconductor Layer]

An oxide semiconductor having a wider band gap and a lower carrier density than silicon is preferably used as the oxide semiconductor contained in the semiconductor layer 102, in which case an off-state current of the transistor can be reduced.

There is no particular limitation on the crystallinity of a semiconductor used for the semiconductor layer 102, and an amorphous semiconductor or a semiconductor having crystallinity (a microcrystalline semiconductor, a polycrystalline semiconductor, a single crystal semiconductor, a semiconductor partly including crystal regions, or a semiconductor including crystal regions in the whole area) may be used. A semiconductor having crystallinity is preferably used for the semiconductor layer 102, in which case deterioration of transistor characteristics can be reduced.

As the semiconductor layer 102, it is particularly preferable to use a layer including a plurality of crystal parts. In the plurality of crystal parts, c-axes are aligned substantially perpendicular to a surface on which the semiconductor layer 102 is formed (a top surface of the first protective insulating layer 111 in FIGS. 1B and 1C) or the top surface of the semiconductor layer 102, and the crystal parts adjacent to each other have no grain boundary.

The use of such a material for the semiconductor layer 102 can suppress a change in the electrical characteristics, which allows the transistor 100 to have high reliability.

The semiconductor layer 102 may have a single-layer structure or a stacked-layer structure of two or more layers. In the case of the stacked-layer structure, a combination of two or more oxide semiconductor films with different compositions may be used.

Note that details of a preferable mode and a method for forming an oxide semiconductor applicable to the semiconductor layer 102 are described in an embodiment below.

[Substrate]

There is no particular limitation on the property of a material and the like of the substrate 101 as long as the material has heat resistance enough to withstand at least heat treatment in the process. For example, a glass substrate, a ceramic substrate, a quartz substrate, a sapphire substrate, an yttria-stabilized zirconia (YSZ) substrate, or the like may be used as the substrate 101. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used.

Still alternatively, any of the above-described semiconductor substrates or the SOI substrate provided with a semiconductor element may be used as the substrate 101. In this case, the transistor 100 is formed over the substrate 101 with an interlayer insulating layer provided therebetween. The transistor 100 in this case may have a structure in which at least one of the gate electrode 105 and the pair of electrodes 103 is electrically connected to the above semiconductor element by a connection electrode embedded in the interlayer insulating layer. Forming the transistor 100 over the semiconductor element with the interlayer insulating layer interposed therebetween can suppress an increase in area due to the formation of the transistor 100.

[Gate Electrode]

The gate electrode 105 can be formed using a metal selected from aluminum, chromium, copper, tantalum, titanium, molybdenum, and tungsten; an alloy containing any of these metals as a component; an alloy containing any of these metals in combination; or the like. Alternatively, one or both of manganese and zirconium may be used. Still alternatively, a semiconductor typified by polycrystalline silicon doped with an impurity element such as phosphorus, or a silicide such as nickel silicide may be used. Furthermore, the gate electrode 105 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more metals selected from titanium, tantalum, tungsten, molybdenum, chromium, neodymium, and scandium may be used.

Still alternatively, the gate electrode 105 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

An In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 105 and the gate insulating layer 104. These films each have a work function of 5 eV or higher, preferably 5.5 eV or higher, which is higher than the electron affinity of an oxide semiconductor; thus, the threshold voltage of a transistor including the oxide semiconductor can be shifted in the positive direction. Accordingly, a switching element having what is called normally-off characteristics can be obtained. For example, as an In—Ga—Zn-based oxynitride semiconductor film, an In—Ga—Zn-based oxynitride semiconductor film having a higher nitrogen concentration than at least the semiconductor layer 102, specifically an In—Ga—Zn-based oxynitride semiconductor film having a nitrogen concentration higher than or equal to 7 at. %, is used.

[Gate Insulating Layer]

The gate insulating layer 104 can be formed to have a single-layer structure or a stacked-layer structure using, for example, one or more of silicon oxide, silicon oxynitride, silicon nitride oxide, aluminum oxide, hafnium oxide, gallium oxide, Ga—Zn-based metal oxide, silicon nitride, and the like.

Alternatively, the gate insulating layer 104 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, in which case gate leakage current of the transistor can be reduced.

[Pair of Electrodes]

The pair of electrodes 103 can be formed to have a single-layer structure or a stacked-layer structure using, as a conductive material, any of metals such as aluminum, titanium, chromium, nickel, copper, yttrium, zirconium, molybdenum, silver, tantalum, and tungsten, or an alloy containing any of these metals as its main component. For example, a single-layer structure of an aluminum film containing silicon, a two-layer structure in which a titanium film is stacked over an aluminum film, a two-layer structure in which a titanium film is stacked over a copper film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The above is the description of the structural example of the transistor 100 and each of the components.

[Example of Manufacturing Method 1]

An Example of a Method for Manufacturing the Transistor 100 illustrated in FIG. 1A to 1C is described below with reference to the drawings. FIGS. 2A to 2E are schematic cross-sectional views of steps in the manufacturing method described below as an example.

[Formation of First Protective Insulating Layer]

Figure 2A:
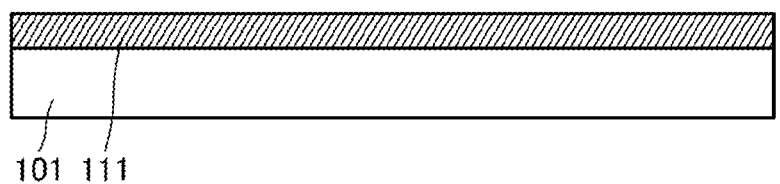
FIGS. 2A to 2E illustrate an example of a method for manufacturing the semiconductor device of the embodiment.

First, the first protective insulating layer 111 is formed over the substrate 101 (FIG. 2A).

The first protective insulating layer 111 can be formed by a sputtering method or the like in an atmosphere containing oxygen, for example. Alternatively, the first protective insulating layer 111 may be formed by a chemical vapor deposition (CVD) method, a molecular beam epitaxy (MBE) method, an atomic layer deposition (ALD) method, a pulsed laser deposition (PLD) method, or the like in an atmosphere containing oxygen.

In the case where an aluminum oxide film is used as the first protective insulating layer 111, for example, the first protective insulating layer 111 can be formed in an atmosphere containing oxygen with the use of aluminum oxide as a sputtering target. Note that an inert gas such as a rare gas may be contained in a deposition gas. Oxygen is preferably contained in the deposition gas so that the flow rate of the oxygen accounts for 20% or higher, preferably 30% or higher, more preferably 40% or higher of that of the deposition gas. Note that although the aluminum oxide film may be formed by a reactive sputtering method with the use of aluminum as a sputtering target, aluminum oxide is preferably used as the sputtering target because oxygen can be further contained in the film.

[Formation of Semiconductor Layer]

Figure 2B:
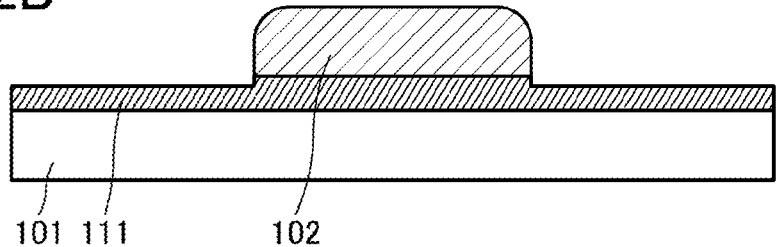

Next, a semiconductor film is formed over the first protective insulating layer 111. A resist mask is formed over the semiconductor film by a photolithography method or the like and unnecessary portions of the semiconductor film are etched. Then, the resist mask is removed. Thus, the island-shaped semiconductor layer 102 can be formed (FIG. 2B).

The semiconductor film can be formed by a sputtering method, a CVD method, a MBE method, an ALD method, a PLD method, or the like. Alternatively, a technique for formation of a thin film using a liquid material, such as a sol-gel method, a spray method, or a mist method, can be used. The semiconductor film is preferably formed by a sputtering method. As the sputtering method, an RF sputtering method, a DC sputtering method, an AC sputtering method, or the like can be used. In particular, a DC sputtering method is preferably used because dust generated in the film formation can be reduced and the film thickness can be uniform.

Note that heat treatment may be performed after the formation of the semiconductor film. The heat treatment may be performed at 250° C. or higher and 650° C. or lower, preferably 300° C. or higher and 500° C. or lower in an inert gas atmosphere, in an atmosphere containing an oxidization gas at 10 ppm or more, or under reduced pressure. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. By the heat treatment, oxygen is supplied from the first protective insulating layer 111 to the semiconductor film (or the semiconductor layer 102), which enables a reduction in oxygen vacancies in the oxide semiconductor included in the semiconductor layer 102. Note that the heat treatment may be performed directly after the formation of the semiconductor film or may be performed after the semiconductor film is processed into the island-shaped semiconductor layer 102.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning a beam such as an electron beam, a photomask is not needed.

Figure 26A:
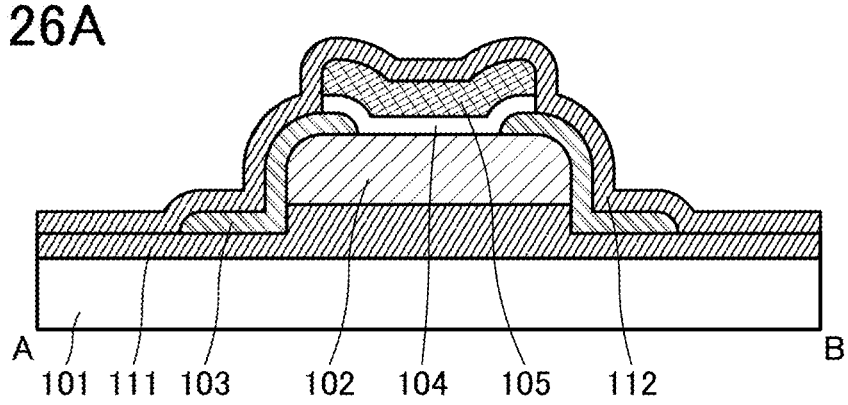
FIGS. 26A and 26B illustrate a structural example of a semiconductor device of an embodiment.
Figure 26B:
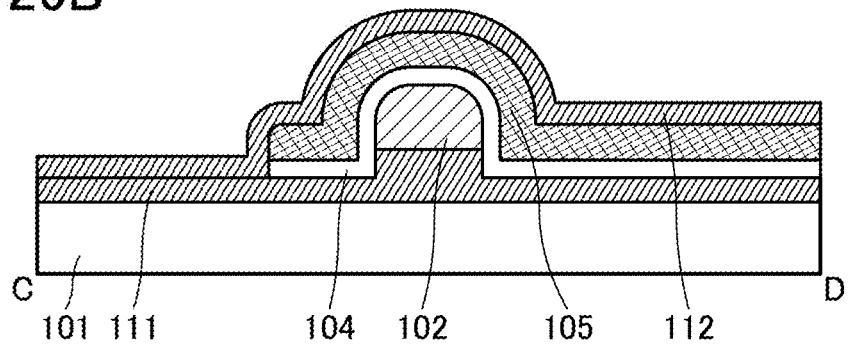

Here, as illustrated in FIG. 2B, in etching the semiconductor film, the first protective insulating layer 111 might be partly etched to have a small thickness in a region where the semiconductor layer 102 does not overlap with the first protective insulating layer 111. When the top surface of the first protective insulating layer 111 that is in the vicinity of the semiconductor layer 102 is positioned lower than an undersurface of the semiconductor layer 102, lower parts of the side surfaces of the semiconductor layer 102 can be surrounded by the gate electrode 105 formed later. Consequently, the electric field from the gate electrode 105 is sufficiently applied to the lower parts of the side surfaces of the semiconductor layer 102, which makes it possible to increase the on-state current of the transistor 100. As illustrated in FIGS. 26A and 26B, the first protective insulating layer 111 is preferably partly etched in a manner similar to the above so that an undersurface of the gate electrode 105 is positioned lower than the undersurface of the semiconductor layer 102, in which case the on-state current of the transistor 100 can be further increased.

The first protective insulating layer 111 is not etched in some cases depending on the material of the first protective insulating layer 111 and etching conditions of the semiconductor film. At this time, the coverage with a film formed over the semiconductor layer 102 is increased, which is preferable.

Furthermore, as illustrated in FIG. 2B, the semiconductor layer 102 is preferably processed so that the top surface thereof has smooth curved edges. Such a shape tends to be obtained particularly in the case where the semiconductor layer 102 is finely processed. The semiconductor layer 102 with such a shape is preferable because the coverage with a film formed thereover is increased and thus variations and a change in the electrical characteristics of the transistor 100 can be suppressed.

[Formation of Pair of Electrodes]

Next, a conductive film is formed over the first protective insulating layer 111 and the semiconductor layer 102. A resist mask is formed over the conductive film by a photolithography method or the like and unnecessary portions of the conductive film are etched. Then, the resist mask is removed. Thus, the pair of electrodes 103 can be formed (FIG. 2C).

The conductive film can be formed by a sputtering method, an evaporation method, a CVD method, or the like, for example.

Figure 2C:
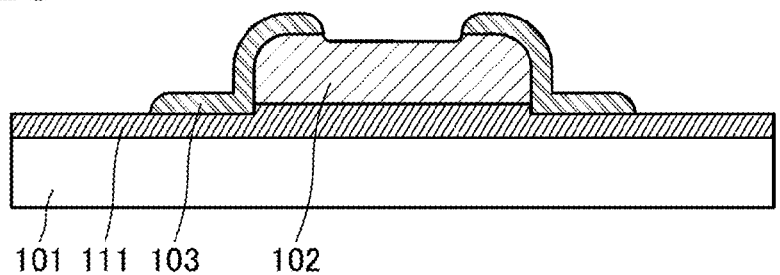

Here, as illustrated in FIG. 2C, in some cases, an upper portion of the semiconductor layer 102 is partly etched in the etching of the conductive film to reduce the thickness of a portion where the pair of electrodes 103 does not overlap with the semiconductor layer 102. For this reason, the semiconductor film serving as the semiconductor layer 102 is preferably formed to have a large thickness in advance in consideration of the etching depth.

Although not clearly illustrated in FIG. 2C, also in the etching of the conductive film, part of the first protective insulating layer 111 might be etched to have a small thickness in a manner similar to the above.

[Formation of Gate Insulating Layer and Gate Electrode]

Figure 2D:
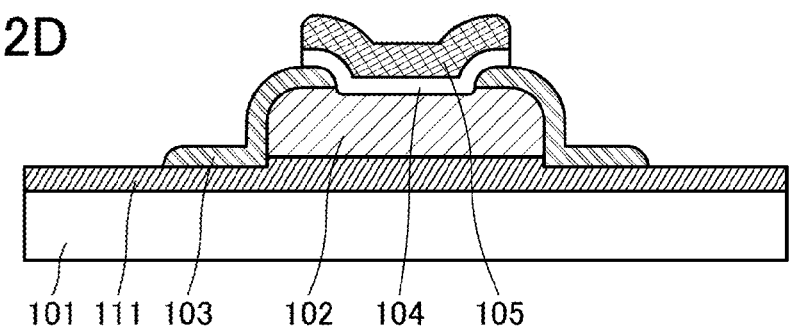

Next, an insulating film is formed over the semiconductor layer 102, the pair of electrodes 103, and the first protective insulating layer 111. Next, a conductive film is formed over the insulating film. A resist mask is formed over the conductive film by a photolithography method or the like and unnecessary portions of the conductive film and the insulating films are etched. Then, the resist mask is removed. Thus, the gate electrode 105 and the gate insulating layer 104 can be formed (FIG. 2D).

The insulating film serving as the gate insulating layer 104 can be formed by a sputtering method, a CVD method, an MBE method, an ALD method, a PLD method, or the like. In particular, it is preferable that the insulating film be formed by a CVD method, further preferably a plasma CVD method because coverage can be further improved.

The conductive film serving as the gate electrode 105 can be formed by a sputtering method, an evaporation method, a CVD method, or the like, for example.

Note that here, the gate insulating layer 104 is etched at the same time when the gate electrode 105 is formed, so that the gate insulating layer 104 is processed to have a shape similar to that of the gate electrode 105 when seen from above.

However, the gate insulating layer 104 and the gate electrode 105 may be processed individually so that the gate insulating layer 104 extends to the outside of the gate electrode 105. At this time, a multi-tone mask such as a gray-tone mask or a half-tone mask is preferably used as a light-exposure mask used in the photolithography method or the like, in which case the manufacturing process can be simplified.

[Formation of Second Protective Insulating Layer]

Figure 2E:
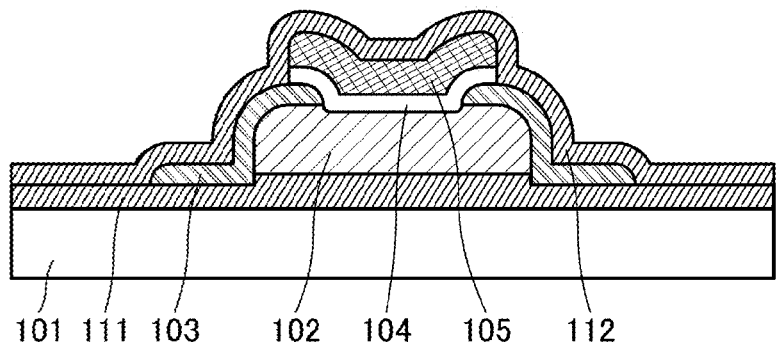

Next, the second protective insulating layer 112 is formed over the first protective insulating layer 111, the pair of electrodes 103, the gate insulating layer 104, and the gate electrode 105 (FIG. 2E).

The second protective insulating layer 112 can be formed by a method similar to that of the first protective insulating layer 111.

Here, the second protective insulating layer 112 is provided in contact with the first protective insulating layer 111 in a region where the pair of electrodes 103 and the gate electrode 105 are not provided. Thus, the first protective insulating layer 111 and the second protective insulating layer 112 can surround the semiconductor layer 102.

Through the above steps, the transistor 100 can be manufactured.

[Heat Treatment]

Heat treatment may be performed after the second protective insulating layer 112 is formed. Through the heat treatment, oxygen is supplied from the first protective insulating layer 111 and the second protective insulating layer 112 to the semiconductor layer 102, whereby oxygen vacancies in the semiconductor layer 102 can be reduced. At this time, release of oxygen from the semiconductor layer 102 is inhibited by the first protective insulating layer 111 and the second protective insulating layer 112, so that formation of oxygen vacancies in the semiconductor layer 102 can be inhibited.

The above is the description of the example of the manufacturing process of the transistor 100.

[Modification Examples of Structural Example 1]

Structural examples of a transistor that are partly different from the structure of the transistor described in the structural example 1 are described below. Note that description of the portions already described is omitted and only different portions are described in detail. Even when positions and shapes of components are different from those in the above example, the same reference numerals are used as long as the components have the same functions as those in the above example, and detailed description thereof is omitted in some cases.

Modification Example 1

Figure 3A:
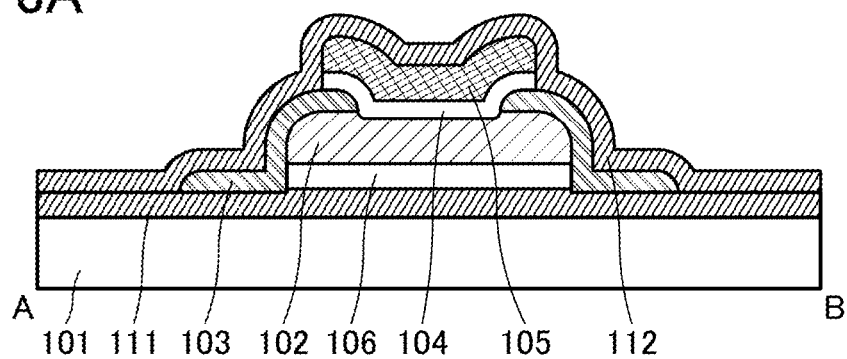
FIGS. 3A and 3B illustrate a structural example of a semiconductor device of an embodiment.
Figure 3B:
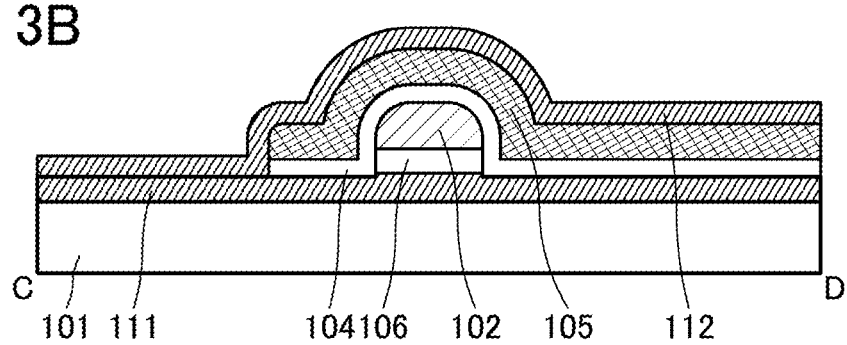

FIGS. 3A and 3B are schematic cross-sectional views of a transistor described as an example below. Note that a schematic top view of the transistor can be referred to FIG. 1A. The transistor illustrated in FIGS. 3A and 3B is different from that in FIGS. 1B and 1C mainly in that an insulating layer 106 is provided between the semiconductor layer 102 and the first protective insulating layer 111.

The insulating layer 106 provided under the semiconductor layer 102 preferably contains an oxide insulating material that releases oxygen when heated. With the insulating layer 106 provided under the semiconductor layer 102, due to heat applied in heat treatment or the like in the manufacturing process of the transistor, more oxygen can be supplied to the semiconductor layer 102. Furthermore, with a structure in which the insulating layer 106, the semiconductor layer 102, and the like are surrounded by the first protective insulating layer 111 and the second protective insulating layer 112, oxygen released from the insulating layer 106 is inhibited from being diffused to the outside (the substrate 101 side or above the second protective insulating layer 112), which makes it possible to supply oxygen to the semiconductor layer 102 more effectively.

Although the insulating layer 106 can be provided to cover the top surface of the first protective insulating layer 111, as illustrated in FIGS. 3A and 3B, the insulating layer 106 is preferably processed with the same resist mask as the semiconductor layer 102 so that the shapes of the semiconductor layer 102 and the insulating layer 106 are substantially aligned with each other when seen from above. With such a structure, the first protective insulating layer 111 and the second protective insulating layer 112 are in contact with each other in the region where the gate electrode 105 and the pair of electrodes 103 are not provided, so that an oxygen diffusion path is blocked; thus, oxygen can be supplied to the semiconductor layer 102 effectively.

As the insulating layer 106, an oxide insulating film containing oxygen in excess of the stoichiometric composition is preferably used. Part of oxygen is released by heating from the oxide insulating film containing oxygen in excess of the stoichiometric composition. The oxide insulating film containing oxygen in excess of the stoichiometric composition is an oxide insulating film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis.

In the case of forming a silicon oxide film or a silicon oxynitride film as the insulating layer 106 by a plasma CVD method, a deposition gas containing silicon and an oxidization gas are preferably used as a source gas. Typical examples of the deposition gas containing silicon include silane, disilane, trisilane, and silane fluoride. Examples of the oxidization gas include oxygen, ozone, dinitrogen monoxide, and nitrogen dioxide.

For example, a silicon oxide film or a silicon oxynitride film is formed in the following conditions: the substrate placed in a vacuum-evacuated treatment chamber of a plasma CVD apparatus is held at a temperature higher than or equal to 180° C. and lower than or equal to 260° C., preferably higher than or equal to 200° C. and lower than or equal to 240° C., to the treatment chamber is charged a source gas at a pressure greater than or equal to 100 Pa and less than or equal to 250 Pa, preferably greater than or equal to 100 Pa and less than or equal to 200 Pa, and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the film formation conditions, the high-frequency power having the above power density is supplied to the treatment chamber having the above pressure, whereby the decomposition efficiency of the source gas in plasma is increased, oxygen radicals are increased, and oxidation of the source gas is promoted; therefore, oxygen is contained in the oxide insulating film containing oxygen in excess of the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen in excess of the stoichiometric composition and from which part of oxygen is released by heating.

Modification Example 2

Figure 4:
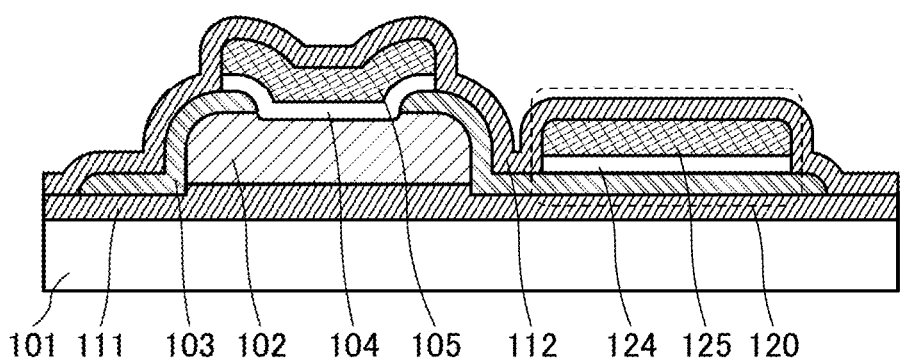
FIG. 4 illustrates a structural example of a semiconductor device of an embodiment.

FIG. 4 illustrates an example of forming a capacitor 120 adjacent to the transistor 100.

The capacitor 120 includes one of the pair of electrodes 103 of the transistor 100, an electrode 125 formed by processing the conductive film also used for the gate electrode 105, and a dielectric layer 124 between the one of the pair of electrodes 103 and the electrode 125 that is formed by processing the insulating film also used for the gate insulating layer 104.

Being formed by processing the films used in manufacturing the transistor 100 in such a manner, the capacitor 120 can be manufactured at the same time as the transistor 100 without increasing the number of manufacturing steps.

Note that although the one of the pair of electrodes 103 of the transistor 100 is used as one electrode of the capacitor 120 in FIG. 4, one embodiment of the present invention is not limited to this. An electrode formed by processing the conductive film also used for the pair of electrodes 103 of the transistor 100 may be used as the one electrode of the capacitor 120. Alternatively, at least the gate electrode 105 and the electrode 125 may be formed as one continuous film. Still alternatively, at least the gate insulating layer 104 and the dielectric layer 124 may be formed as one continuous film.

Here, as a material of the insulating film used to form the gate insulating layer 104 and the dielectric layer 124, a high dielectric constant material such as aluminum oxide, hafnium oxide, zirconium oxide, tantalum oxide, titanium oxide, strontium titanate, or barium titanate is preferably used. Alternatively, any of these materials containing a metal such as lanthanum, aluminum, yttrium, or tungsten or a material containing an oxide of any of these metals may be used. Still alternatively, a stacked-layer structure of films containing any of the above materials may be used.

As the insulating film, an oxide insulating film containing oxygen in excess of the stoichiometric composition is preferably used. With the use of such an insulating film, due to heat applied in heat treatment or the like in the manufacturing process of the transistor, oxygen can be supplied from the gate insulating layer 104 to the semiconductor layer 102.

The above is the description of the modification examples.

Structural Example 2

Structural examples of a transistor that are partly different from the structure of the transistor described in the structural example 1 are described below. Note that portions similar to those described above are not described in some cases.

Figure 5A:
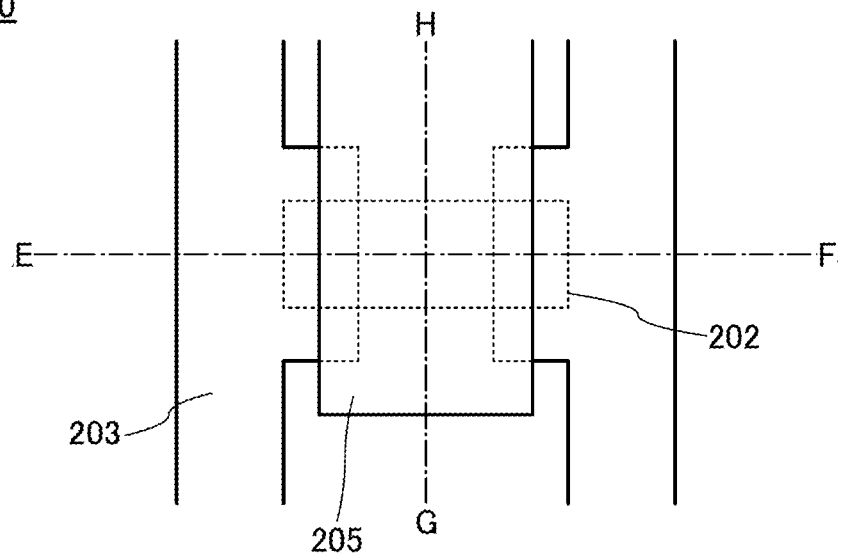
FIGS. 5A to 5C illustrate a structural example of a semiconductor device of an embodiment.
Figure 5B:
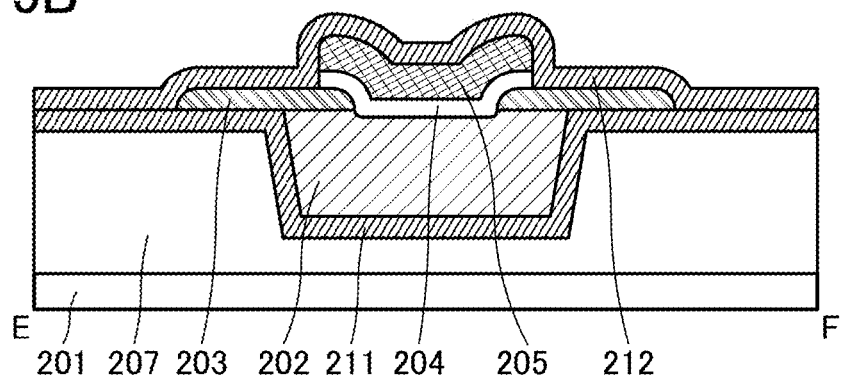
Figure 5C:
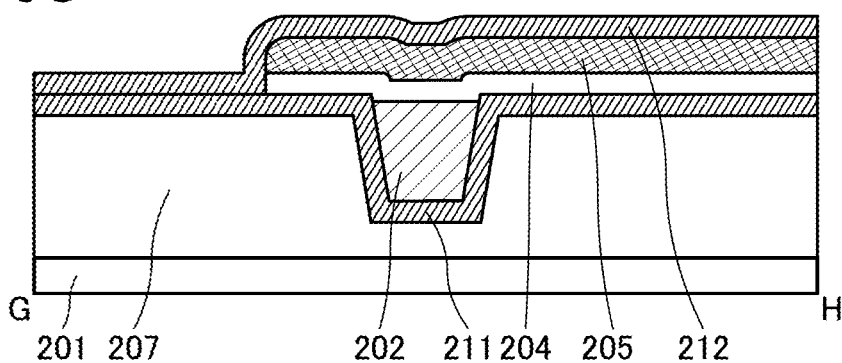

FIG. 5A is a schematic top view of a transistor 200 described as an example in this structural example. FIG. 5B is a schematic cross-sectional view taken along line E-F in FIG. 5A, and FIG. 5C is a schematic cross-sectional view taken along line G-H in FIG. 5A. Note that some components are not illustrated in FIG. 5A for clarification.

The transistor 200 includes an insulating layer 207 that is provided over a substrate 201 and includes a groove, a semiconductor layer 202 that is provided over the groove to fill the groove, a pair of electrodes 203 that is provided over the semiconductor layer 202 and electrically connected to the semiconductor layer 202, a gate insulating layer 204 that is over the pair of electrodes 203 and overlaps with the semiconductor layer 202, and a gate electrode 205 that is over the gate insulating layer 204 and overlaps with the semiconductor layer 202.

In addition, under the semiconductor layer 202, a first protective insulating layer 211 is provided to cover side surfaces and a bottom surface of the groove in the insulating layer 207. As illustrated in FIGS. 5B and 5C, the first protective insulating layer 211 is preferably provided to cover a top surface of the insulating layer 207 that is in a region where the groove is not provided. A second protective insulating layer 212 is provided to cover the pair of electrodes 203 and the gate electrode 205. Furthermore, the first protective insulating layer 211 and the second protective insulating layer 212 are in contact with each other in a region where the pair of electrodes 203 and the gate electrode 205 are not provided.

For the semiconductor layer 202, the pair of electrodes 203, the gate insulating layer 204, the gate electrode 205, and the like, materials similar to those of the semiconductor layer 102, the pair of electrodes 103, the gate insulating layer 104, the gate electrode 105, and the like in the structural example 1 can be used. For the first protective insulating layer 211 and the second protective insulating layer 212, materials similar to those of the first protective insulating layer 111 and the second protective insulating layer 112 in the structural example 1 can be used.

The first protective insulating layer 211 is provided to cover the side surfaces and the bottom surface of the groove provided in the insulating layer 207, and the semiconductor layer 202 is provided to fill the groove. The side surfaces and the undersurface of the semiconductor layer 202 are surrounded by the first protective insulating layer 211. This makes it possible to inhibit diffusion of impurities such as hydrogen from the insulating layer 207 into the semiconductor layer 202 and release of oxygen from the semiconductor layer 202 to the insulating layer 207.

Furthermore, the thickness of the semiconductor layer 202 can be increased by adjusting the depth of the groove; therefore, the on-state current of the transistor 200 and the withstanding voltage between a source and a drain can be easily increased. In the case where a thick semiconductor layer is formed over a flat surface, a film formed thereover is difficult to cover the semiconductor layer, and the film might be divided or a region with low density might be formed in the film. In contrast, in this structural example, the semiconductor layer 202 is provided to fill the groove, and the top surface of the semiconductor layer 202 and the top surface of the first protective insulating layer 211 are substantially equal to each other in height. For this reason, the thick semiconductor layer 202 can be formed without adversely affecting the coverage with the film formed over the semiconductor layer 202.

The above is the description of the structural example of the transistor 200.

[Example of Manufacturing Method 2]

An example of a method for manufacturing the transistor 200 illustrated in FIG. 5A to 5C is described below with reference to the drawings. FIGS. 6A to 6E are schematic cross-sectional views of steps in the manufacturing method described below as an example.

[Formation of Insulating Layer]

First, the insulating layer 207 is formed over the substrate 201.

The insulating layer 207 can be formed by a sputtering method, a CVD method, an evaporation method, or the like.

For the insulating layer 207, an insulating material such as silicon oxide, silicon oxynitride, silicon nitride, silicon nitride oxide, aluminum oxide, aluminum oxynitride, gallium oxide, gallium oxynitride, yttrium oxide, yttrium oxynitride, hafnium oxide, or hafnium oxynitride can be used.

Alternatively, as the insulating layer 207, a stacked-layer structure including films of different insulating materials may be used. With the insulating layer 207 having a stacked-layer structure, a lower layer in the stacked-layer structure can serve as an etching stopper when the groove is formed in a later step.

[Formation of Groove]

Next, a resist mask is formed over the insulating layer 207 by a photolithography method or the like, and an upper portion of the insulating layer 207 is removed. Then, the resist mask is removed. Thus, the groove can be formed in the insulating layer 207.

Here, as described above, a multi-layered structure including films of different materials is employed for the insulating layer 207, so that etching can be easily performed. Furthermore, with the use of a lower layer in the multi-layered structure as an etching stopper, the groove can have a flat bottom surface, which is preferable.

In the case of forming a groove with a great depth, the resist mask might disappear during the etching. In such a case, a thin film is formed in advance using a material which is less likely to be etched in etching the insulating layer 207 (i.e., a material with which the etching selectivity of the insulating layer 207 to the thin film is high), and etched using the resist mask. Then, an upper portion of the insulating layer 207 may be etched with the use of the thin film as a hard mask to form the groove. When the thin film used as the hard mask has an insulating property, the hard mask may be left even after the groove is formed.

[Formation of First Protective Insulating Layer]

Figure 6A:
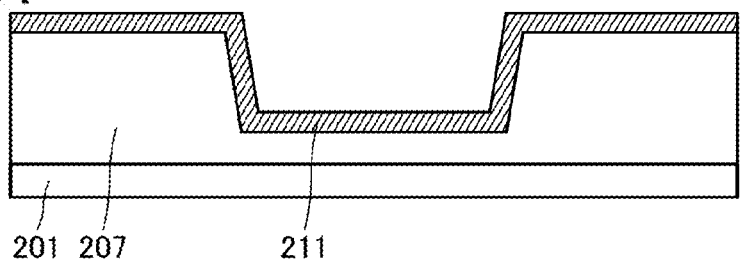
FIGS. 6A to 6E illustrate an example of a method for manufacturing the semiconductor device of the embodiment.

Next, the first protective insulating layer 211 is formed over the insulating layer 207 to cover the side surfaces and the bottom surface of the groove (FIG. 6A).

The first protective insulating layer 211 is formed in a manner similar to that of the first protective insulating layer 111 in the example of the manufacturing method 1.

[Formation of Semiconductor Layer]

Next, a semiconductor film is formed over the first protective insulating layer 211. In the case of filling the groove with the semiconductor film completely, a top surface of the semiconductor film that overlaps with the groove is preferably positioned higher than or equal to the top surface of the first protective insulating layer 211 that does not overlap with the groove.

The semiconductor film can be formed in a manner similar to that in the example of the manufacturing method 1.

Heat treatment may be performed after the formation of the semiconductor film. The heat treatment can be performed in a manner similar to that in the example of the manufacturing method 1. By the heat treatment, oxygen is supplied from the first protective insulating layer 211 to the semiconductor film (or the semiconductor layer 202), which enables a reduction in oxygen vacancies in the oxide semiconductor included in the semiconductor layer 202. Note that the heat treatment may be performed directly after the formation of the semiconductor film or may be performed after the semiconductor film is processed into the island-shaped semiconductor layer 202.

Figure 6B:
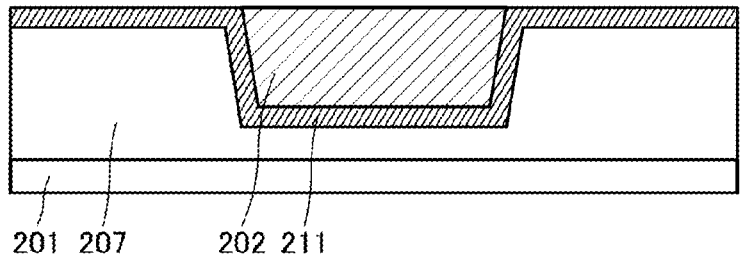

Next, planarization treatment is performed to process the semiconductor film and the first protective insulating layer 211 so that the top surface of the semiconductor film is aligned with the top surface of the first protective insulating layer 211 that does not overlap with the groove; thus, the island-shaped semiconductor layer 202 embedded in the groove can be formed (FIG. 6B).

As the planarization treatment, etching treatment or polishing treatment such as chemical mechanical polishing (CMP) may be performed.

Here, in the case where aluminum oxide or the like is used for the first protective insulating layer 211 and polishing treatment such as CMP is used as the planarization treatment, the first protective insulating layer 211 can serve as an etching stopper. Consequently, a decrease in the thickness of the semiconductor layer 202 due to the planarization treatment can be inhibited; moreover, variation in the thickness can be reduced.

[Formation of Pair of Electrodes]

Next, a conductive film is formed over the first protective insulating layer 211 and the semiconductor layer 202. A resist mask is formed over the conductive film by a photolithography method or the like and unnecessary portions of the conductive film are etched. Then, the resist mask is removed. Thus, the pair of electrodes 203 can be formed (FIG. 6C).

The conductive film can be formed by a sputtering method, an evaporation method, a CVD method, or the like, for example.

Figure 6C:
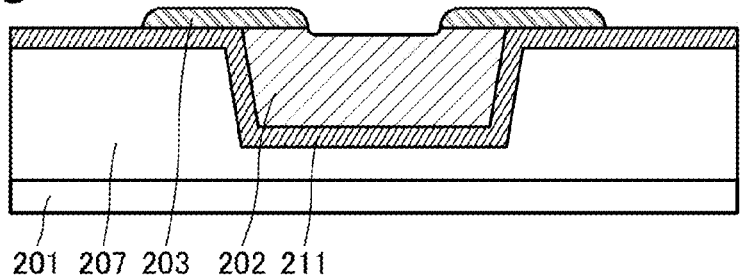

Here, as illustrated in FIG. 6C, in some cases, an upper portion of the semiconductor layer 202 is partly etched in the etching of the conductive film to reduce the thickness of a portion where the pair of electrodes 203 does not overlap with the semiconductor layer 202. For this reason, the semiconductor film serving as the semiconductor layer 202 is preferably formed to have a large thickness (i.e., the groove is preferably formed to have a large depth) in advance in consideration of the etching depth.

Although not clearly illustrated in FIG. 6C, in the etching of the conductive film, part of the first protective insulating layer 211 might be etched to have a small thickness in some cases.

[Formation of Gate Insulating Layer and Gate Electrode]

Figure 6D:
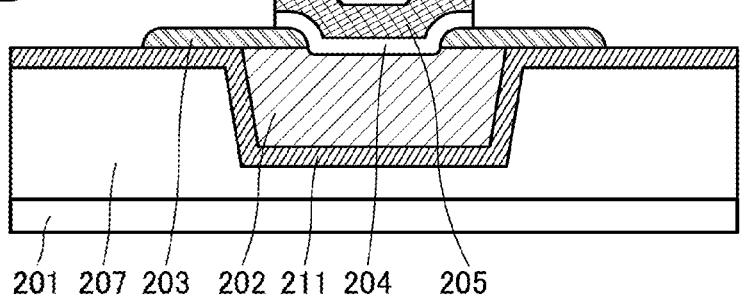

Next, an insulating film is formed over the semiconductor layer 202, the pair of electrodes 203, and the first protective insulating layer 211. Next, a conductive film is formed over the insulating film. A resist mask is formed over the conductive film by a photolithography method or the like and unnecessary portions of the conductive film and the insulating films are etched. Then, the resist mask is removed. Thus, the gate electrode 205 and the gate insulating layer 204 can be formed (FIG. 6D).

The insulating film serving as the gate insulating layer 204 and the conductive film serving as the gate electrode 205 can be formed in a manner similar to those in the example of the manufacturing method 1.

Note that here, the gate insulating layer 204 is etched at the same time when the gate electrode 205 is formed, so that the gate insulating layer 204 is processed to have a shape similar to that of the gate electrode 205 when seen from above. However, the gate insulating layer 204 and the gate electrode 205 may be processed individually so that the gate insulating layer 204 extends to the outside of the gate electrode 205. At this time, a multi-tone mask such as a gray-tone mask or a half-tone mask is preferably used as a light-exposure mask used in the photolithography method or the like, in which case the manufacturing process can be simplified.

[Formation of Second Protective Insulating Layer]

Figure 6E:
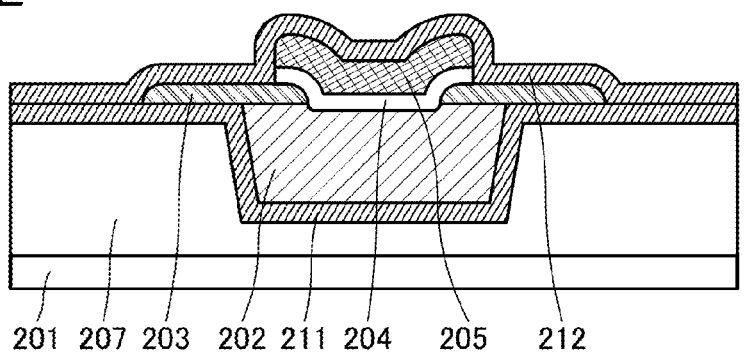

Next, the second protective insulating layer 212 is formed over the first protective insulating layer 211, the pair of electrodes 203, the gate insulating layer 204, and the gate electrode 205 (FIG. 6E).

The second protective insulating layer 212 can be formed by a method similar to that of the first protective insulating layer 211.

Here, the second protective insulating layer 212 is provided in contact with the first protective insulating layer 211 in a region where the pair of electrodes 203 and the gate electrode 205 are not provided. Thus, the first protective insulating layer 211 and the second protective insulating layer 212 can surround the semiconductor layer 202.

Through the above steps, the transistor 200 can be manufactured.

[Heat Treatment]

Heat treatment may be performed after the second protective insulating layer 212 is formed. Through the heat treatment, oxygen is supplied from the first protective insulating layer 211 and the second protective insulating layer 212 to the semiconductor layer 202, whereby oxygen vacancies in the semiconductor layer 202 can be reduced. At this time, release of oxygen from the semiconductor layer 202 is inhibited by the first protective insulating layer 211 and the second protective insulating layer 212, so that formation of oxygen vacancies in the semiconductor layer 202 can be inhibited.

The above is the description of the example of the manufacturing process of the transistor 200.

[Modification Examples of Structural Example 2]

Structural examples of a transistor that are partly different from the structure of the transistor described in the structural example 2 are described below. Note that description of the portions already described is omitted and only different portions are described in detail. Even when positions and shapes of components are different from those in the structural example 2, the same reference numerals are used as long as the components have the same functions as those in the structural example 2, and detailed description thereof is omitted in some cases.

Modification Example 1

Figure 7A:
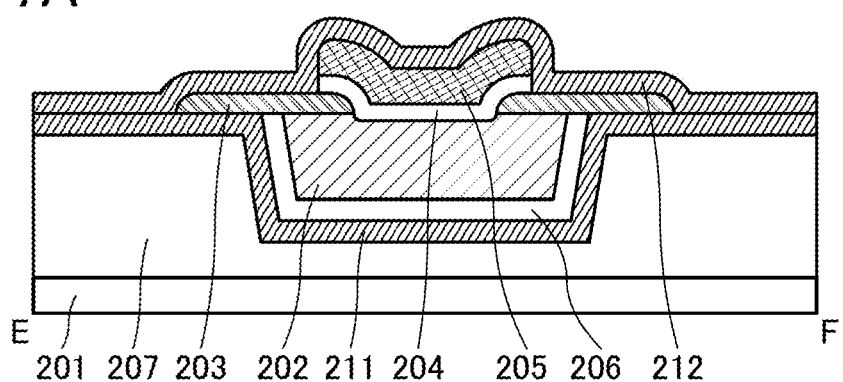
FIGS. 7A and 7B illustrate a structural example of a semiconductor device of an embodiment.
Figure 7B:
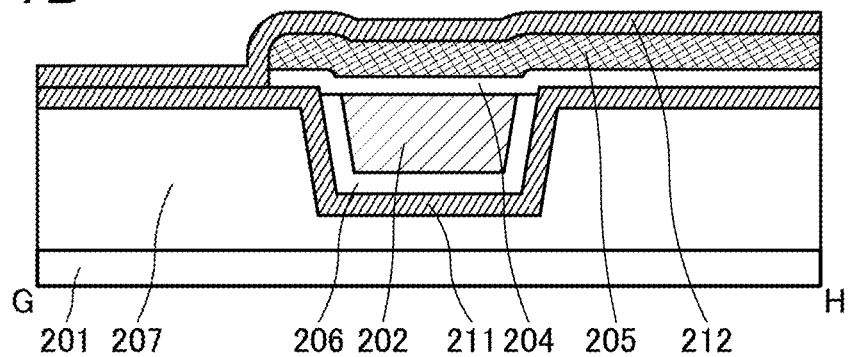

FIGS. 7A and 7B are schematic cross-sectional views of a transistor described as an example below. Note that a schematic top view of the transistor can be referred to FIG. 5A. The transistor illustrated in FIGS. 7A and 7B is different from that in FIGS. 5B and 5C mainly in that an insulating layer 206 is provided between the semiconductor layer 202 and the first protective insulating layer 211.

In a groove provided in the insulating layer 207, the insulating layer 206 is provided to cover side surfaces and a top surface of the first protective insulating layer 211. The insulating layer 206 is provided to cover the side surfaces and the undersurface of the semiconductor layer 202.

The insulating layer 206 provided under the semiconductor layer 202 preferably contains an oxide insulating material that releases oxygen when heated. With the insulating layer 206 provided under the semiconductor layer 202, because of heat applied in heat treatment or the like in the manufacturing process of the transistor, more oxygen can be supplied to the semiconductor layer 202. Furthermore, with a structure in which the insulating layer 206, the semiconductor layer 202, and the like are surrounded by the first protective insulating layer 211 and the second protective insulating layer 212, oxygen released from the insulating layer 206 is inhibited from being diffused to the outside (the insulating layer 207 side or above the second protective insulating layer 212), which makes it possible to supply oxygen to the semiconductor layer 202 more effectively.

The insulating layer 206 can be provided to cover also the top surface of the first protective insulating layer 211 that does not overlap with the groove; however, the insulating layer 206 is preferably processed to be provided inside the groove by the planarization treatment. With such a structure, the first protective insulating layer 211 and the second protective insulating layer 212 are in contact with each other in the region where the gate electrode 205 and the pair of electrodes 203 are not provided, so that an oxygen diffusion path is blocked; thus, oxygen can be supplied to the semiconductor layer 202 effectively.

As the insulating layer 206, an oxide insulating film containing oxygen in excess of the stoichiometric composition is preferably used, which is similar to the case of the above-described insulating layer 106.

Modification Example 2

Figure 8:
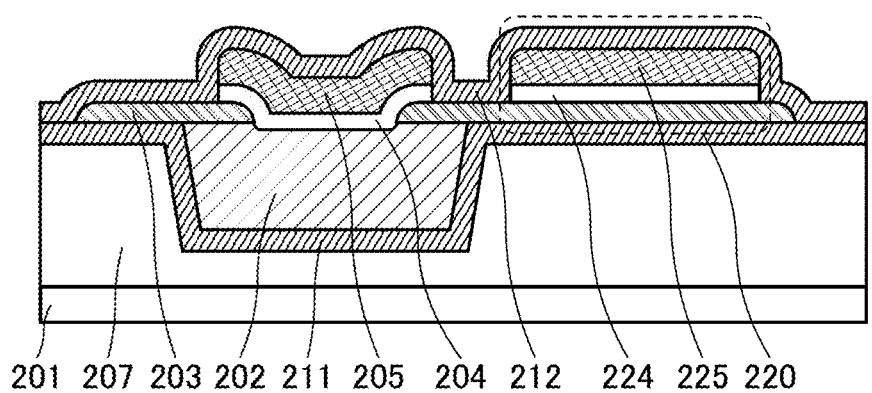
FIG. 8 illustrates a structural example of a semiconductor device of an embodiment.

FIG. 8 illustrates an example of forming a capacitor 220 adjacent to the transistor 200.

The capacitor 220 includes one of the pair of electrodes 203 of the transistor 200, an electrode 225 formed by processing the conductive film also used for the gate electrode 205, and a dielectric layer 224 between the one of the pair of electrodes 203 and the electrode 225 that is formed by processing the insulating film also used for the gate insulating layer 204.

Being formed by processing the films used in manufacturing the transistor 200 in such a manner, the capacitor 220 can be manufactured at the same time as the transistor 200 without increasing the number of manufacturing steps.

Note that although the one of the pair of electrodes 203 of the transistor 200 is used as one electrode of the capacitor 220 in FIG. 8, one embodiment of the present invention is not limited to this. An electrode formed by processing the conductive film also used for the pair of electrodes 203 of the transistor 200 may be used as the one electrode of the capacitor 220. Alternatively, at least the gate electrode 205 and the electrode 225 may be formed as one continuous film. Still alternatively, at least the gate insulating layer 204 and the dielectric layer 224 may be formed as one continuous film Here, as a material of the insulating film used to form the gate insulating layer 204 and the dielectric layer 224, a high dielectric constant material such as aluminum oxide, hafnium oxide, zirconium oxide, tantalum oxide, titanium oxide, strontium titanate, or barium titanate is preferably used. Alternatively, any of these materials containing a metal such as lanthanum, aluminum, yttrium, or tungsten or a material containing an oxide of any of these metals may be used. Still alternatively, a stacked-layer structure of films containing any of the above materials may be used.

As the insulating film, an oxide insulating film containing oxygen in excess of the stoichiometric composition is preferably used. With the use of such an insulating film, due to heat applied in heat treatment or the like in the manufacturing process of the transistor, oxygen can be supplied from the gate insulating layer 204 to the semiconductor layer 202.

Modification Example 3

In the case of arranging a plurality of transistors over a substrate, the integration density of the transistors can be further increased by providing a groove not for each transistor but for a plurality of transistors.

Figure 9A:
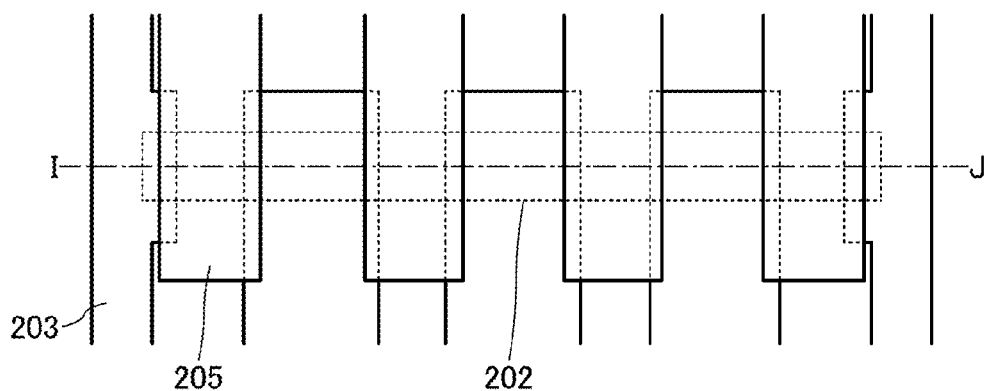
FIGS. 9A to 9D illustrate a structural example of a semiconductor device of an embodiment and circuit diagrams thereof
Figure 9B:
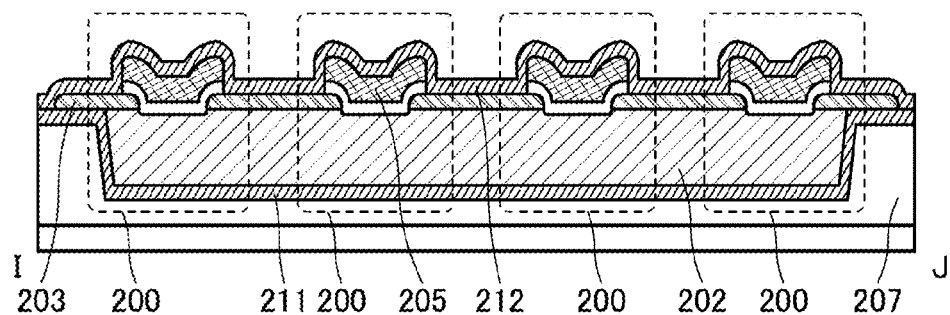

As an example, FIGS. 9A to 9D illustrate the case of forming four transistors 200, which are connected in series, in an upper portion of a groove provided in the insulating layer 207. FIG. 9A is a schematic top view and FIG. 9B is a schematic cross-sectional view taken along line I-J in FIG. 9A.

As illustrated in FIG. 9B, the four transistors 200 are formed in the upper portion of the groove formed in the insulating layer 207. The two adjacent transistors 200 share an electrode 203, and thus are connected in series. On the other hand, the gate electrode 205 is provided for each of the transistors 200.

The first protective insulating layer 211 and the second protective insulating layer 212 are provided to surround the four transistors 200 and in contact with each other outside the electrodes 203 provided over both ends of the groove.

Figure 9C:
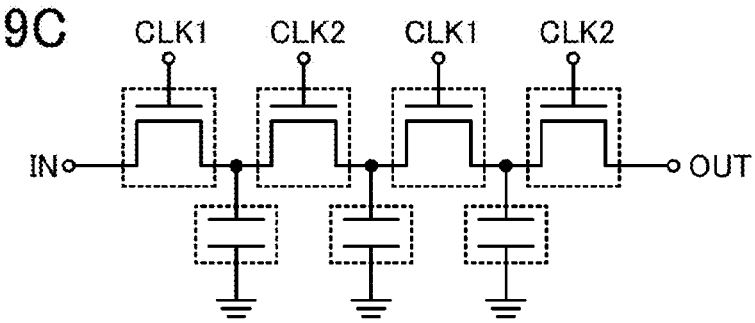

FIG. 9C illustrates an example of a circuit configuration which can be used for the transistors 200 connected in series as described above. A circuit illustrated in FIG. 9C includes four transistors and three capacitors. In the two adjacent transistors, a source or a drain of one of the transistors is electrically connected to a source or a drain of the other thereof to form a node, and one electrode of the capacitor is electrically connected to the node.

The structure of the capacitor 220 described in the modification example 2 can be used for the capacitor, for example.

The circuit illustrated in FIG. 9C can serve as, for example, a shift register by application of a potential described below.

A common potential is applied to the other electrodes of the three capacitors. In the four transistors, a clock signal (CLK1) is applied to gates of the first and third transistors from the left, and a clock signal (CLK2) is applied to gates of the second and fourth transistors from the left. One of the source and the drain of the first transistor is an input terminal to which an input potential (IN) is applied, and one of the source and the drain of the fourth transistor is an output terminal from which an output potential (OUT) is output. As CLK1 and CLK2, clock signals having potentials with which adjacent transistors are alternately turned on and are not in an on state in the same period (e.g., high-level potential) are used, which makes it possible to shift data of a potential applied to the input terminal from the left to the right.

Figure 9D:
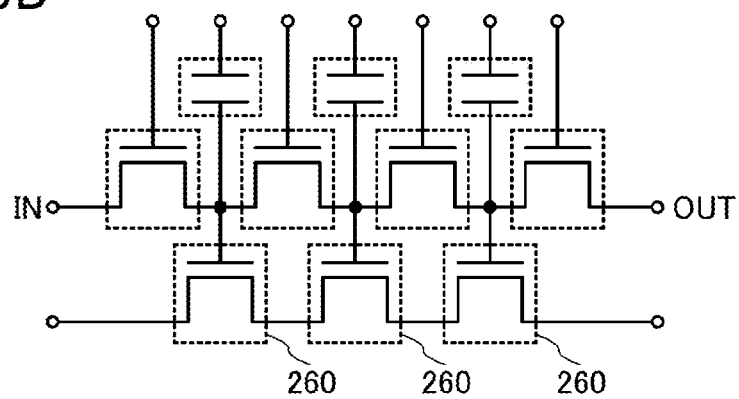

FIG. 9D illustrates a configuration in which a plurality of reading transistors 260 connected in series are added to the circuit illustrated in FIG. 9C. Each of the transistors 260 is electrically connected to a node to which the one electrode of the capacitor is connected. A reading potential is applied to each of the other electrodes of the capacitors. With such a structure, a circuit illustrated in FIG. 9D can serve as a NAND memory device that can read data of a potential held in the node connected to the one electrode of the capacitor at any time. Here, the transistor 260 may be a transistor using an oxide semiconductor, which is similar to the transistor 200, or a transistor using another semiconductor, which is described as an example in the following embodiment.

The above is the description of the modification examples.

This embodiment can be implemented in combination with any of the other embodiments described in this specification as appropriate.

Embodiment 2

In this embodiment, a structural example of a transistor with a structure partly different from that of the transistor described in Embodiment 1 as an example is described. Note that description of the portions already described is omitted and only different portions are described in detail. Even when positions and shapes of components are different from those in the above structural examples, the same reference numerals are used as long as the components have the same functions as those in the above structural examples, and detailed description thereof is omitted in some cases.

A semiconductor device of one embodiment of the present invention preferably includes an oxide layer between an oxide semiconductor layer and a gate insulating layer overlapping with the oxide semiconductor layer, and an oxide layer between the oxide semiconductor layer and a protective insulating layer overlapping with the oxide semiconductor layer. The oxide layers each contain at least one metal element contained in the oxide semiconductor layer. This makes it possible to inhibit formation of a trap state at the interface between the oxide semiconductor layer and the insulating layer overlapping with the oxide semiconductor layer;

accordingly, deterioration of the electrical characteristics of the transistor can be suppressed.

That is, one embodiment of the present invention preferably has a structure in which at least a top surface and an undersurface of an oxide semiconductor layer are covered with an oxide layer serving as a barrier film that prevents formation of an interface state at an interface with the oxide semiconductor layer, the top surface and side surfaces of the oxide semiconductor layer in the channel width direction are covered with a gate electrode with a gate insulating layer provided therebetween, and insulating layers each including an aluminum oxide film are provided to wrap the oxide semiconductor layer. This structure makes it possible to inhibit generation of oxygen vacancies and mixing of impurities, which cause carriers in the oxide semiconductor layer and an interface with the oxide semiconductor layer, so that the oxide semiconductor layer is highly purified to be an intrinsic oxide semiconductor layer. The expression being "highly purified to be an intrinsic oxide semiconductor layer" refers to being purified or substantially purified to be an intrinsic or substantially intrinsic oxide semiconductor layer. Consequently, a change in the electrical characteristics of a transistor including the oxide semiconductor layer is suppressed, which enables a semiconductor device to have high reliability.

Note that in this specification and the like, in the case of the substantially purified oxide semiconductor layer, the carrier density thereof is lower than $1 \times 10^{17}/cm^3$, lower than $1 \times 10^{15}/cm^3$, or lower than $1 \times 10^{13}/cm^3$. With a highly purified intrinsic oxide semiconductor layer, the transistor can have stable electric characteristics.

More specifically, the following structures can be employed for example.

Structural Example 1

Figure 10A:
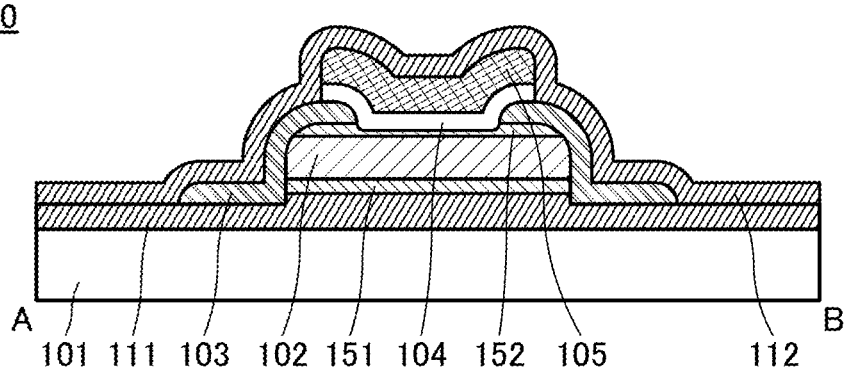
FIGS. 10A and 10B illustrate an example of a structure of a semiconductor device of an embodiment.
Figure 10B:
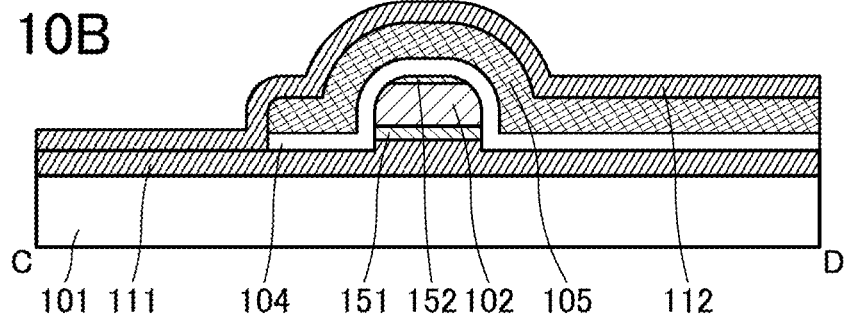

FIGS. 10A and 10B are schematic cross-sectional views of a transistor 150 described as an example below. Note that a schematic top view of the transistor 150 can be referred to FIG. 1A. The transistor 150 illustrated in FIGS. 10A and 10B differs from the transistor 100 described as an example in Embodiment 1 mainly in that a first oxide layer 151 and a second oxide layer 152 are included.

The first oxide layer 151 is provided between the first protective insulating layer 111 and the semiconductor layer 102. The second oxide layer 152 is provided between the semiconductor layer 102 and the gate insulating layer 104.

Specifically, a top surface of the second oxide layer 152 is in contact with undersurfaces of the pair of electrodes 103 and an undersurface of the gate insulating layer 104.

The first oxide layer 151 and the second oxide layer 152 each contain an oxide containing one or more of the metal elements contained in the semiconductor layer 102.

Note that the boundary between the semiconductor layer 102 and the first oxide layer 151 or the boundary between the semiconductor layer 102 and the second oxide layer 152 is not clear in some cases.

For example, the first oxide layer 151 and the second oxide layer 152 each contain In or Ga; the first oxide layer 151 and the second oxide layer 152 each contain, for example, a material typified by an In—Ga-based oxide, an In—Zn-based oxide, or an In—M-Zn-based oxide (M is Al, Ti, Ga, Y, Zr, La, Ce, Nd, or Hf). In addition, the energy of the conduction band minimum of the material is closer to a vacuum level than that of the semiconductor layer 102 is, and typically, the difference between the energy of the conduction band minimum of the first oxide layer 151 or the second oxide layer 152 and the energy of the conduction band minimum of the semiconductor layer 102 is preferably 0.05 eV or higher, 0.07 eV or higher, 0.1 eV or higher, or 0.15 eV or higher and 2 eV or lower, 1 eV or lower, 0.5 eV or lower, or 0.4 eV or lower.

An oxide having a Ga (serving as a stabilizer) content higher than that of the semiconductor layer 102 is used for the first oxide layer 151 and the second oxide layer 152, between which the semiconductor layer 102 is sandwiched, in which case release of oxygen from the semiconductor layer 102 can be inhibited.

When an In—Ga—Zn-based oxide in which the atomic ratio of In to Ga and Zn is 1:1:1 or 3:1:2 is used for the semiconductor layer 102, for example, an In—Ga—Zn-based oxide in which the atomic ratio of In to Ga and Zn is 1:3:2, 1:3:4, 1:3:6, 1:6:4, 1:6:8, 1:6:10, or 1:9:6 can be used for the first oxide layer 151 or the second oxide layer 152. Note that the atomic ratio of each of the semiconductor layer 102, the first oxide layer 151, and the second oxide layer 152 may vary within a range of ±20% of any of the above-described atomic ratios as an error. For the first oxide layer 151 and the second oxide layer 152, materials with the same composition or material with different compositions may be used.

Further, when an In—M-Zn-based oxide is used for the semiconductor layer 102, an oxide containing metal elements in the atomic ratio satisfying the following conditions is preferably used for a target for forming the semiconductor film serving as the semiconductor layer 102. Given that the atomic ratio of the metal elements in the oxide is In:M:Zn=$x_1$:$y_1$:$z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1, In:M:Zn=3:1:2, or the like.

When an In—M-Zn-based oxide is used for the first oxide layer 151 and the second oxide layer 152, an oxide containing metal elements in the following atomic ratio is preferably used for a target for forming oxide films serving as the first oxide layer 151 and the second oxide layer 152. Given that the atomic ratio of the metal elements in the oxide is In:M:Zn=$x_2$:$y_2$:$z_2$, it is preferable that $x_2/y_2$ be less than $x_1/y_1$, and $z_2/y_2$ be greater than or equal to ⅓ and less than or equal to 6, preferably greater than or equal to 1 and less than or equal to 6. Note that when $z_2/y_2$ is less than or equal to 6, a CAAC-OS film to be described later is easily formed. Typical examples of the atomic ratio of the metal elements in the target are In:M:Zn=1:3:4, In:M:Zn=1:3:6, In:M:Zn=1:3:8, or the like.

By using a material in which the energy level of the conduction band minimum is closer to the vacuum level than that of the semiconductor layer 102 is for the first oxide layer 151 and the second oxide layer 152, a channel is mainly formed in the semiconductor layer 102, so that the semiconductor layer 102 serves as a main current path. When the semiconductor layer 102 in which a channel is formed is sandwiched between the first oxide layer 151 and the second oxide layer 152 as described above, generation of interface states between these layers is suppressed, and thus reliability of the electrical characteristics of the transistor is improved.

Note that, without limitation to those described above, a material with an appropriate composition may be used depending on required semiconductor characteristics and electrical characteristics (e.g., field-effect mobility and threshold voltage) of a transistor. In order to obtain the required semiconductor characteristics of the transistor, it is preferable that the carrier density, the impurity concentration, the defect density, the atomic ratio of a metal element to oxygen, the interatomic distance, the density, and the like of each of the semiconductor layer 102, the first oxide layer 151, and the second oxide layer 152 be set to appropriate values.

Here, the thickness of the semiconductor layer 102 is preferably larger than that of the first oxide layer 151. The thicker the semiconductor layer 102 is, the larger the on-state current of the transistor is. The thickness of the first oxide layer 151 may be set as appropriate as long as formation of an interface state at an interface with the semiconductor layer 102 is inhibited. For example, the thickness of the semiconductor layer 102 is larger than that of the first oxide layer 151, preferably 2 times or more, further preferably 4 times or more, still further preferably 6 times or more as large as that of the first oxide layer 151.

The thickness of the second oxide layer 152 may be set as appropriate, in a manner similar to that of the first oxide layer 151, as long as formation of an interface state at an interface with the semiconductor layer 102 is inhibited. For example, the thickness of the second oxide layer 152 may be set smaller than or equal to that of the first oxide layer 151. The second oxide layer 152 preferably has a small thickness because the thick second oxide layer 152 might make it difficult for an electric field by the gate electrode 105 to extend to the semiconductor layer 102. Note that the thickness of the second oxide layer 152 is not limited to the above, and may be set as appropriate depending on a driving voltage of the transistor 150 in consideration of the withstanding voltage of the gate insulating layer 104.

Figure 27A:
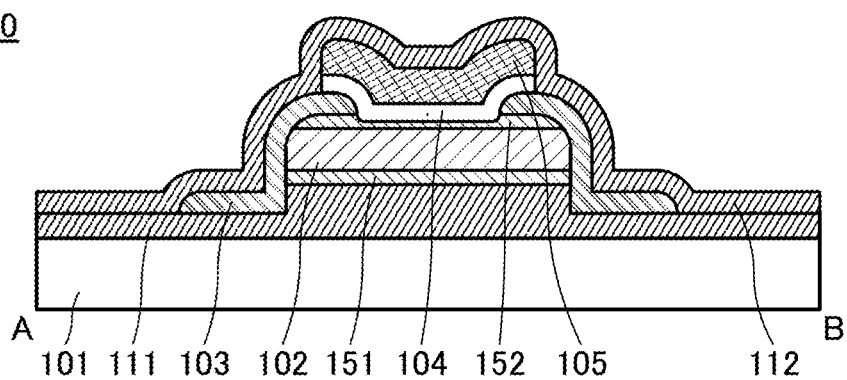
FIGS. 27A and 27B illustrate a structural example of a semiconductor device of an embodiment.
Figure 27B:
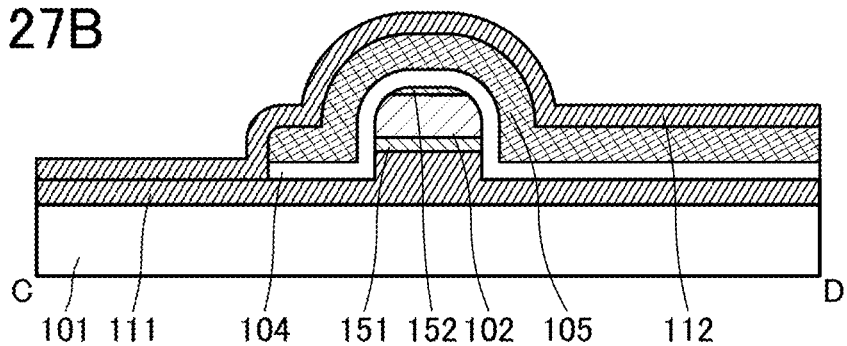

In addition, as illustrated in FIG. 10B, it is preferable that the top surface of the first protective insulating layer 111 in the vicinity of the oxide layer 151 be positioned lower than that of an undersurface of the oxide layer 151, and the lower parts of the side surfaces of the semiconductor layer 102 be surrounded by the gate electrode 105. Consequently, the electric field by the gate electrode 105 is sufficiently applied to the lower parts of the side surface of the semiconductor layer 102, which makes it possible to increase the on-state current of the transistor 150. As illustrated in FIGS. 27A and 27B, the undersurface of the gate electrode 105 is preferably positioned lower than the undersurface of the oxide layer 151, in which case the on-state current of the transistor 150 can be further increased in a manner similar to the above.

Here, a band structure of a channel formation region in the transistor 150 is described.

Figure 11A:
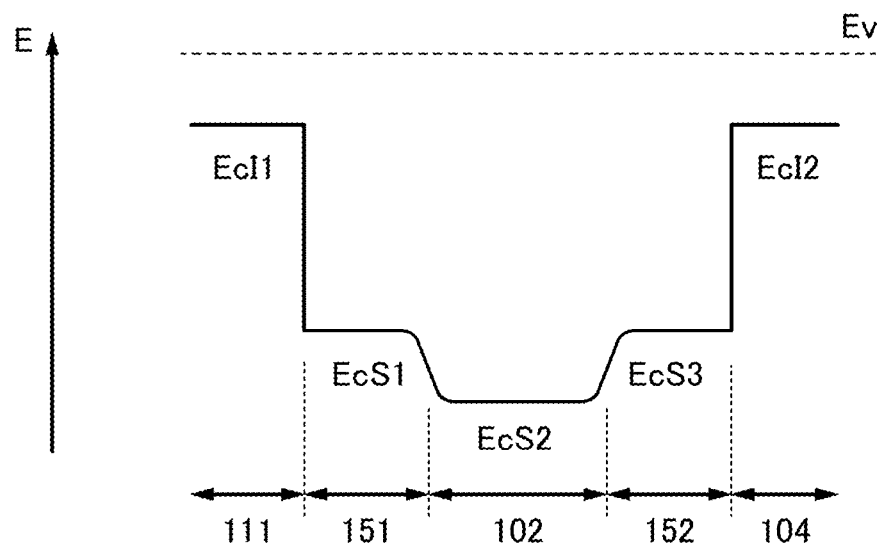
FIGS. 11A and 11B each show a band diagram of an embodiment.
Figure 11B:
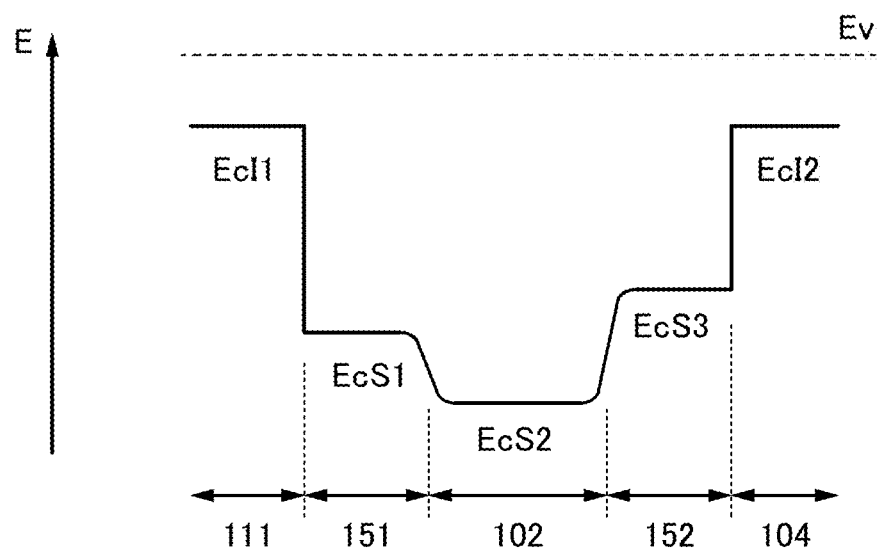

FIGS. 11A and 11B each schematically illustrate a band structure of a channel formation region in the thickness direction.

In FIGS. 11A and 11B, EcI1, EcS1, EcS2, EcS3, EcI2 schematically represent energies at the conduction band minimum of the first protective insulating layer 111, the first oxide layer 151, the semiconductor layer 102, the second oxide layer 152, and the gate insulating layer 104, respectively. Note that the thicknesses of the layers are not considered here for convenience.

Here, an energy difference between the vacuum level and the conduction band minimum (the difference is also referred to as electron affinity) corresponds to a value obtained by subtracting an energy gap from an energy difference between the vacuum level and the valence band maximum (the difference is also referred to as an ionization potential). Note that the energy gap can be measured using a spectroscopic ellipsometer (e.g., UT-300 manufactured by HORIBA JOBIN YVON S.A.S.). Note that the energy difference between the vacuum level and the valence band maximum can be measured using an ultraviolet photoelectron spectroscopy (UPS) device (e.g., VersaProbe manufactured by ULVAC-PHI, Inc.).

As shown in FIG. 11A, energy at the conduction band minimum continuously changes from the first oxide layer 151 through the semiconductor layer 102 to the second oxide layer 152, without an energy barrier therebetween. This is because oxygen is easily diffused between the first oxide layer 151 and the semiconductor layer 102, and between the semiconductor layer 102 and the second oxide layer 152 since these layers have similar compositions, and thus a layer what is called a mixed layer is formed therebetween.

Note that although the case where the first oxide layer 151 and the second oxide layer 152 are oxide layers having the same energy gap is shown in FIG. 11A, the first oxide layer and the second oxide layer may be oxide layers having different energy gaps. For example, FIG. 11B shows part of the band structure in which EcS3 is higher than EcS1. Although not shown, EcS1 may be higher than EcS3.

FIGS. 11A and 11B show that in the channel formation region, the semiconductor layer 102 serves as a well and a channel is formed in the semiconductor layer 102. Note that since the energies at the conduction band minimum are changed continuously, the first oxide layer 151, the semiconductor layer 102, and the second oxide layer 152 can also be referred to as U-shaped wells. Further, a channel formed to have such a structure can also be referred to as a buried channel.

The first oxide layer 151 and the second oxide layer 152 are oxides that contain one or more of the metal elements contained in the semiconductor layer 102; therefore, a stacked-layer structure in which the first oxide layer 151, the semiconductor layer 102, and the second oxide layer 152 are stacked can also be referred to as an oxide stack including layers having the same main component. Hereinafter, the stacked-layer structure in which the first oxide layer 151, the semiconductor layer 102, and the second oxide layer 152 are stacked is also referred to as an oxide stack. The oxide stack including the layers having the same main component is formed not simply by stacking layers but to have a continuous junction (here, in particular, a U-shaped well structure in which energy of the conduction band minimum is changed continuously between the layers). This is because when impurities which form a defect state such as a trap center or a recombination center are mixed at an interface between the layers, the continuity of the energy band is lost, and thus carriers are trapped or disappear by recombination at the interface.

To form a continuous junction, the layers are preferably stacked successively without exposure to the air with use of a multi-chamber deposition apparatus (e.g., a sputtering apparatus) including a load lock chamber. Each chamber in the sputtering apparatus is preferably evacuated to high vacuum (approximately $5 \times 10^{-7}$ Pa to $1 \times 10^{-4}$ Pa) with an entrapment vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

Not only high vacuum evacuation in a chamber but also high purity of a sputtering gas is necessary to obtain a high-purity intrinsic oxide semiconductor. When a highly purified gas having a dew point of −40° C. or lower, preferably −80° C. or lower, more preferably −100° C. or lower is used as an oxygen gas or an argon gas used as a sputtering gas, moisture or the like can be prevented from entering an oxide semiconductor as much as possible.

The first oxide layer 151 under the semiconductor layer 102 and the second oxide layer 152 over the semiconductor layer 102 can function as barrier layers to inhibit the influence of a trap state, which is formed at the interface between the oxide stack and the insulating layer (the first protective insulating layer 111 and the gate insulating layer 104) in contact with the oxide stack, on the semiconductor layer 102 that serves as the main carrier path in the transistor.

For example, oxygen vacancies contained in the semiconductor layer appear as localized states in deep energy area in the energy gap of the oxide semiconductor. A carrier is trapped in such localized states, so that reliability of the transistor is lowered. For this reason, oxygen vacancies contained in the semiconductor layer should be reduced. In the oxide stack, the oxide layers in which oxygen vacancy is less likely to be generated than in the semiconductor layer 102 are provided on and under the semiconductor layer 102 to be in contact with the semiconductor layer 102, whereby oxygen vacancy in the semiconductor layer 102 can be reduced. For example, in the semiconductor layer 102, the absorption coefficient due to the localized levels, which is obtained by measurement by a constant photocurrent method (CPM) is set lower than $1 \times 10^{-3}$/cm, preferably lower than $1 \times 10^{-4}$/cm.

In addition, when the semiconductor layer 102 is in contact with an insulating layer including a different constituent element (e.g., a base insulating layer including a silicon oxide film), an interface state is sometimes formed at the interface of the two layers and the interface state forms a channel. At this time, a second transistor having a different threshold voltage appears, so that an apparent threshold voltage of the transistor is varied. However, since the first oxide layer 151 contains one or more metal elements forming the semiconductor layer 102 in the oxide stack, an interface state is less likely to be formed at the interface between the first oxide layer 151 and the semiconductor layer 102. Thus, the formation of the first oxide layer 151 makes it possible to reduce fluctuation in the electrical characteristics of the transistor, such as threshold voltage.

When a channel is formed at the interface between the gate insulating layer 104 and the semiconductor layer 102, interface scattering occurs at the interface and the field-effect mobility of the transistor is reduced. However, since the second oxide layer 152 contains one or more metal elements forming the semiconductor layer 102 in the oxide stack, scattering of carriers is less likely to occur at the interface between the second oxide layer 152 and the semiconductor layer 102, and thus the field-effect mobility of the transistor can be increased.

Modification Example 2

Figure 12A:
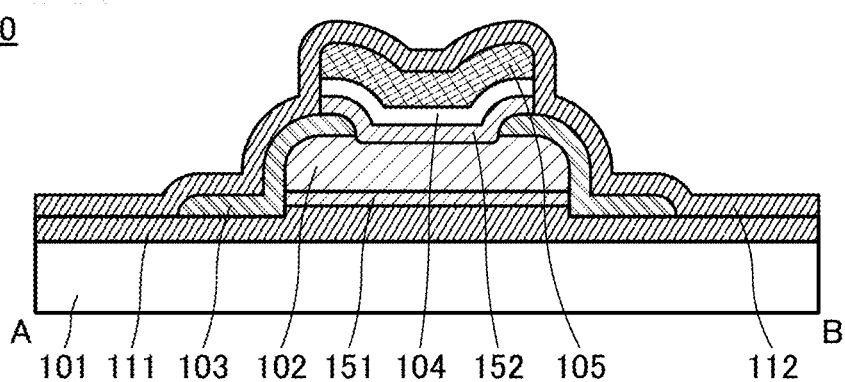
FIGS. 12A and 12B illustrate a structural example of a semiconductor device of an embodiment.
Figure 12B:
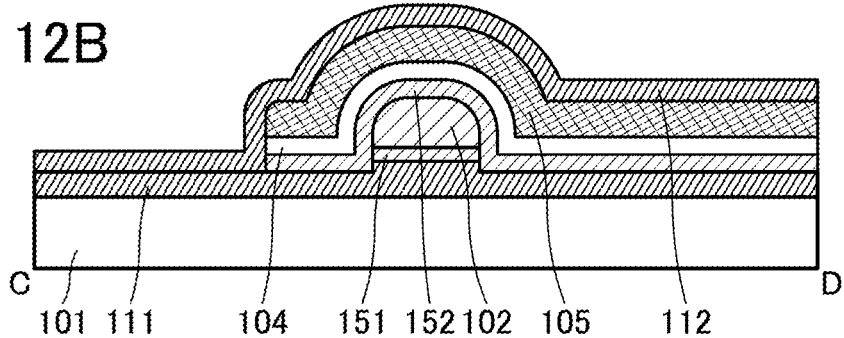

FIGS. 12A and 12B are schematic cross-sectional views of a transistor 160 described as an example below. Note that a schematic top view of the transistor 160 can be referred to FIG. 1A. A main difference between the transistor 160 illustrated in FIGS. 12A and 12B and the above-described transistor 150 is the shape of the second oxide layer 152.

In the transistor 160, an undersurface of the second oxide layer 152 is in contact with top surfaces of the pair of electrodes 103. Furthermore, the second oxide layer 152 is in contact with the top surface and the side surfaces of the semiconductor layer 102 in a region where the pair of electrodes 103 is not provided.

In the structure illustrated in FIGS. 12A and 12B, the second oxide layer 152, the gate insulating layer 104, and the gate electrode 105 are processed with the use of one photomask so that the shapes of the second oxide layer 152, the gate insulating layer 104, and the gate electrode 105 are aligned with one another when seen from above. The second protective insulating layer 112 is in contact with end portions of the second oxide layer 152 and the gate insulating layer 104. Such a structure can inhibit release of oxygen from the semiconductor layer 102 through the end portions of the second oxide layer 152 and the gate insulating layer 104.

As illustrated in FIG. 12B, in the transistor 160, not only the top surface of the semiconductor layer 102 but also the side surfaces thereof are in contact with the second oxide layer 152. That is, the channel formation region in the semiconductor layer 102 is surrounded by the first oxide layer 151 and the second oxide layer 152.

With such a structure, the second oxide layer 152 in contact with the side surfaces of the semiconductor layer 102 can inhibit formation of an interface state at an interface with the semiconductor layer 102 even on the side surfaces of the semiconductor layer 102. Consequently, even in the case of actively using a channel formed in the vicinity of the side surfaces of the semiconductor layer 102, a change in the electrical characteristics of the transistor can be suppressed, which makes it possible to provide a transistor with high on-state current and high reliability.

Figure 28A:
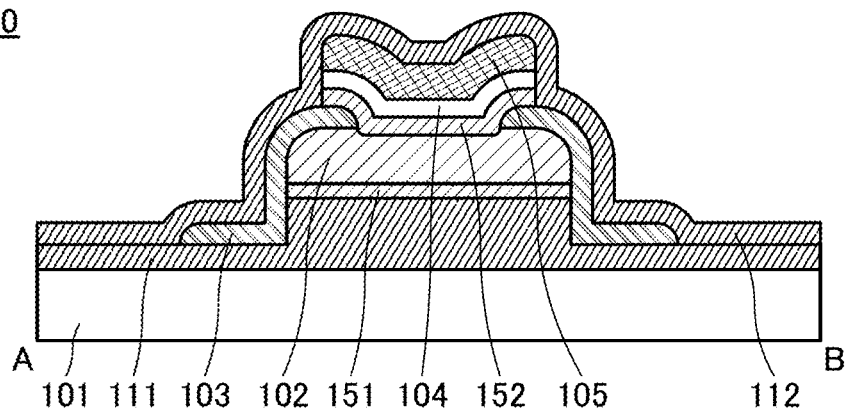
FIGS. 28A and 28B illustrate a structural example of a semiconductor device of an embodiment.
Figure 28B:
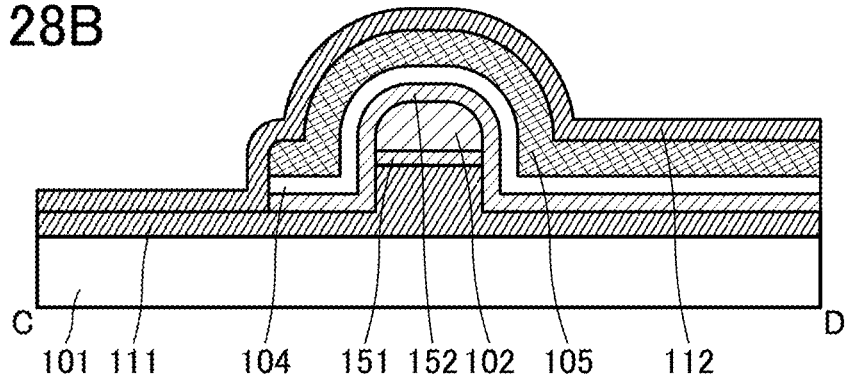

In addition, as illustrated in FIG. 12B, it is preferable that the top surface of the first protective insulating layer 111 in the vicinity of the oxide layer 151 be positioned lower than that of the undersurface of the oxide layer 151, and the lower parts of the side surfaces of the semiconductor layer 102 be surrounded by the gate electrode 105. Consequently, the electric field by the gate electrode 105 is sufficiently applied to the lower parts of the side surface of the semiconductor layer 102, which makes it possible to increase the on-state current of the transistor 160. As illustrated in FIGS. 28A and 28B, the undersurface of the gate electrode 105 is preferably positioned lower than the undersurface of the oxide layer 151, in which case the on-state current of the transistor 160 can be further increased in a manner similar to the above.

In addition, the insulating layer 106 that releases oxygen when heated, which is described as an example in Embodiment 1, can also be used.

Figure 13A:
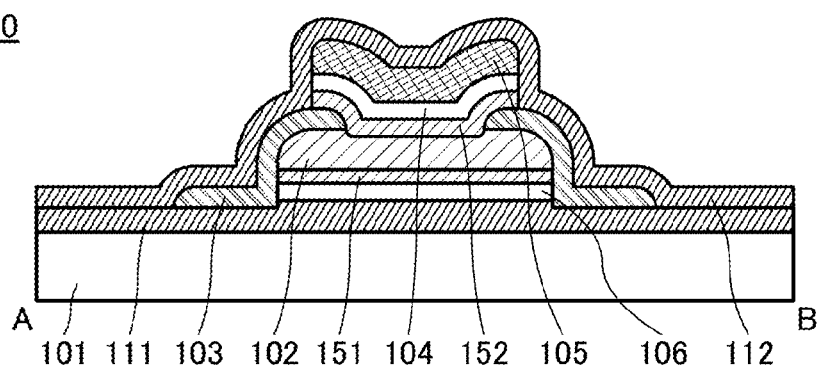
FIGS. 13A to 13D illustrate structural examples of a semiconductor device of an embodiment.
Figure 13B:
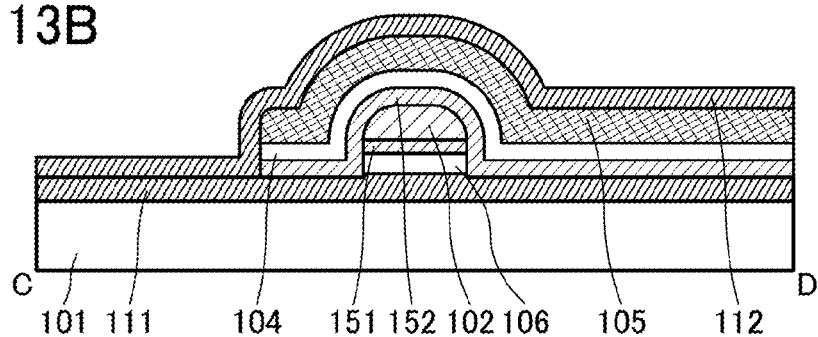

FIGS. 13A and 13B are schematic cross-sectional views of a transistor 170 with a structure different from that of the transistor 160.

The transistor 170 differs from the transistor 160 mainly in that the insulating layer 106 is included between the first oxide layer 151 and the first protective insulating layer 111.

As illustrated in FIGS. 13A and 13B, the semiconductor layer 102, the first oxide layer 151, and the insulating layer 106 are processed to have island shapes, the second oxide layer 152 is provided to cover the semiconductor layer 102, the first oxide layer 151, and the insulating layer 106, and the first protective insulating layer 111 is provided below the second oxide layer 152, the semiconductor layer 102, the first oxide layer 151, and the insulating layer 106; thus, oxygen released from the insulating layer 106 can be supplied to the semiconductor layer 102 through the first oxide layer 151 more effectively.

Figure 29A:
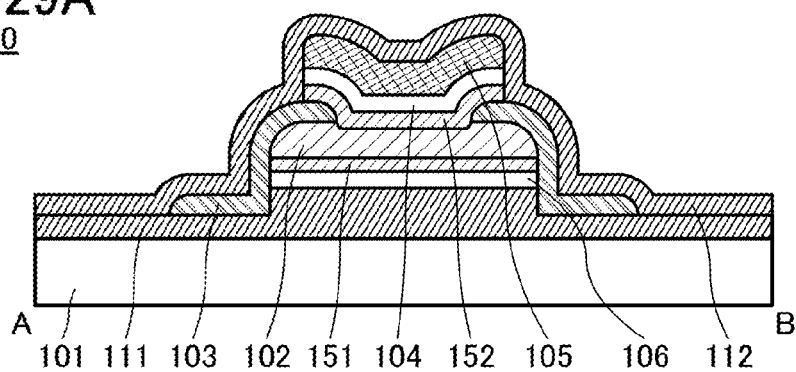
FIGS. 29A to 29D illustrate structural examples of a semiconductor device of an embodiment.
Figure 29B:
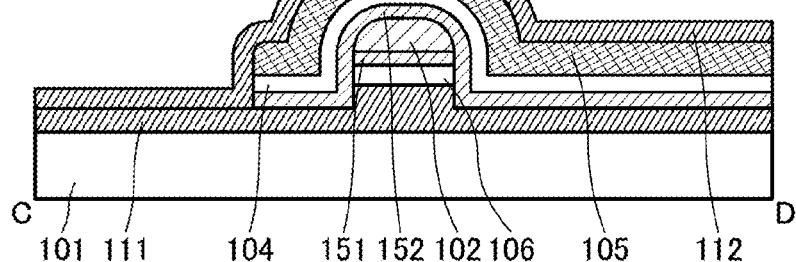

Furthermore, as illustrated in FIG. 13B, it is preferable that the top surface of the first protective insulating layer 111 in the vicinity of the insulating layer 106 be positioned lower than that of an undersurface of the insulating layer 106, and the lower parts of the side surfaces of the semiconductor layer 102 be surrounded by the gate electrode 105. Consequently, the electric field by the gate electrode 105 is sufficiently applied to the lower parts of the side surface of the semiconductor layer 102, which makes it possible to increase the on-state current of the transistor 170. As illustrated in FIGS. 29A and 29B, the undersurface of the gate electrode 105 is preferably positioned lower than the undersurface of the oxide layer 151, in which case the on-state current of the transistor 170 can be further increased in a manner similar to the above.

Figure 13C:
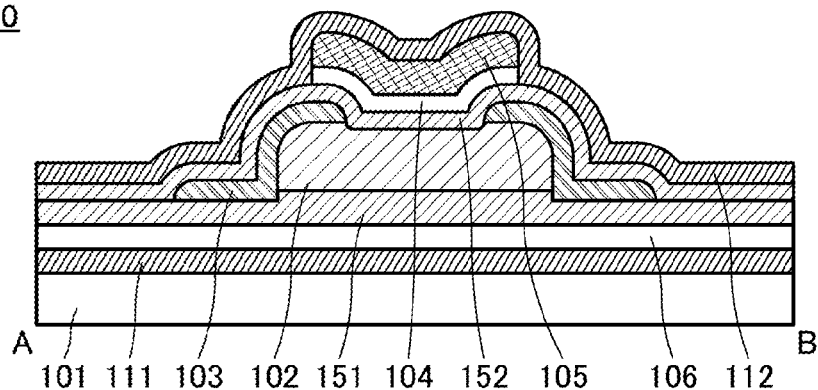
Figure 13D:
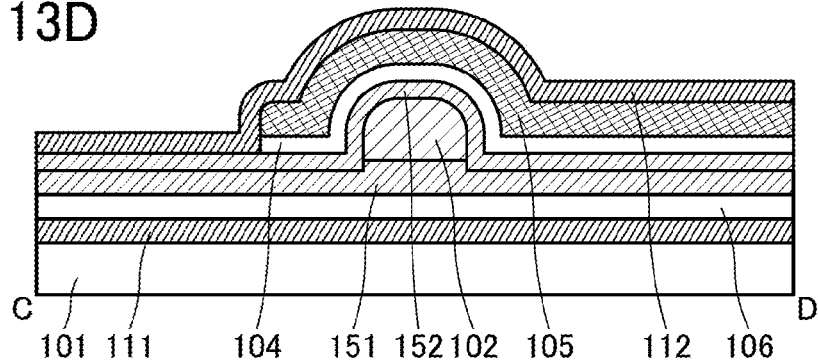

FIGS. 13C and 13D are schematic cross-sectional view of a transistor 180 with a structure partly different from that of the transistor 170. The transistor 180 includes the insulating layer 106, the first oxide layer 151, and the second oxide layer 152 which are not processed to have island shapes. Such a structure can be formed by using a material with a wide band gap for the first oxide layer 151 and the second oxide layer 152.

Note that in the case of the transistor 180, it is preferable that, in a region that is not illustrated, the insulating layer 106, the first oxide layer 151, and the second oxide layer 152 be etched to provide a region where the first protective insulating layer 111 and the second protective insulating layer 112 are in contact with each other. For example, a plurality of transistors may be formed in a region surrounded by the first protective insulating layer 111 and the second protective insulating layer 112.

Figure 29C:
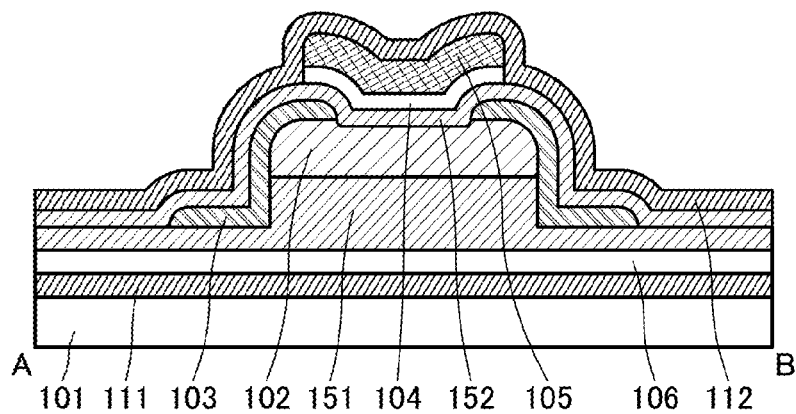
Figure 29D:
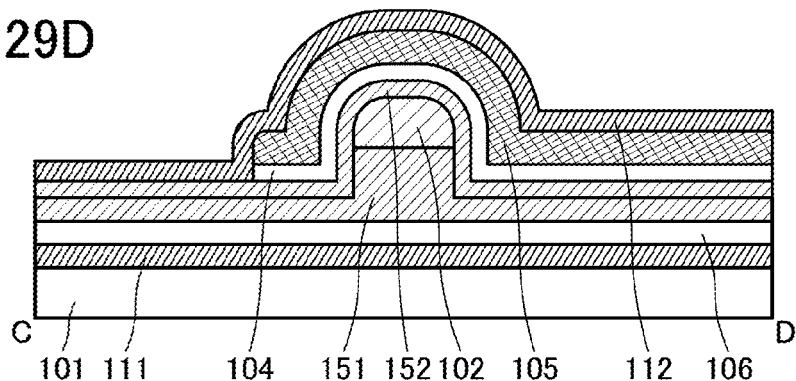

Furthermore, as illustrated in FIG. 13D, it is preferable that the top surface of the first protective insulating layer 111 in the vicinity of the semiconductor layer 102 be positioned lower than that of the undersurface of the semiconductor layer 102, and the lower parts of the side surfaces of the semiconductor layer 102 be surrounded by the gate electrode 105. Consequently, the electric field by the gate electrode 105 is sufficiently applied to the lower parts of the side surface of the semiconductor layer 102, which makes it possible to increase the on-state current of the transistor 180. As illustrated in FIGS. 29C and 29D, the undersurface of the gate electrode 105 is preferably positioned lower than the undersurface of the semiconductor layer 102, in which case the on-state current of the transistor 180 can be further increased in a manner similar to the above.

Structural Example 3

Figure 14A:
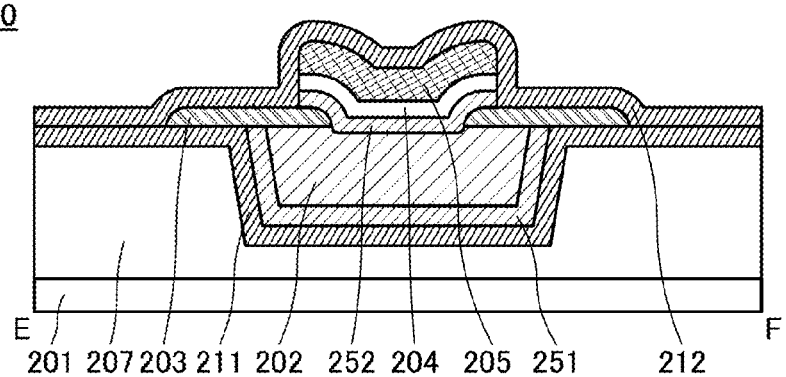
FIGS. 14A to 14D illustrate structural examples of a semiconductor device of an embodiment.
Figure 14B:
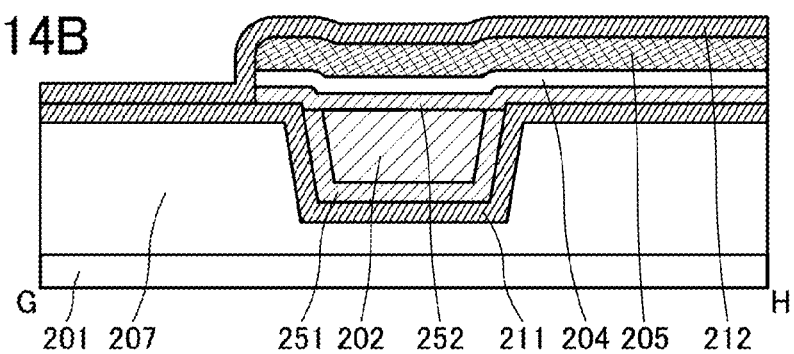

FIGS. 14A and 14B are schematic cross-sectional views of a transistor 250 described as an example below. Note that a schematic top view of the transistor 250 can be referred to FIG. 1A. The transistor 250 illustrated in FIGS. 14A and 14B differs from the transistor 200 described as an example in Embodiment 1 mainly in that a first oxide layer 251 and a second oxide layer 252 are included.

The first oxide layer 251 is provided between the first protective insulating layer 211 and the semiconductor layer 202. The second oxide layer 252 is provided between the semiconductor layer 202 and the gate insulating layer 204.

More specifically, in a groove provided in the insulating layer 207, the first oxide layer 251 is provided to cover the side surfaces and the top surface of the first protective insulating layer 211. The first oxide layer 251 is provided to be in contact with the side surfaces and the undersurface of the semiconductor layer 202.

An undersurface of the second oxide layer 252 is in contact with top surfaces of the pair of electrodes 203. Furthermore, the second oxide layer 252 is in contact with the top surface of the semiconductor layer 202 in a region where the pair of electrodes 203 is not provided.

The first oxide layer 251 and the second oxide layer 252 each contain an oxide containing one or more of the metal elements contained in the semiconductor layer 202.

Note that the boundary between the semiconductor layer 202 and the first oxide layer 251 or the boundary between the semiconductor layer 202 and the second oxide layer 252 is not clear in some cases.

For the first oxide layer 251 and the second oxide layer 252, materials similar to those of the first oxide layer 151 and the second oxide layer 152 can be used, for example.

In the structure illustrated in FIGS. 14A and 14B, the second oxide layer 252, the gate insulating layer 204, and the gate electrode 205 are processed with the use of one photomask so that the shapes of the second oxide layer 252, the gate insulating layer 204, and the gate electrode 205 are aligned with one another when seen from above. The second protective insulating layer 212 is in contact with end portions of the second oxide layer 252 and the gate insulating layer 204. Such a structure can inhibit release of oxygen from the semiconductor layer 202 through the end portions of the second oxide layer 252 and the gate insulating layer 204.

As illustrated in FIG. 14B, in the transistor 250, not only the undersurface of the semiconductor layer 202 but also the side surfaces thereof are in contact with the first oxide layer 251, and the top surface of the semiconductor layer 202 is in contact with the second oxide layer 252. That is, the channel formation region in the semiconductor layer 202 is surrounded by the first oxide layer 251 and the second oxide layer 252.

Such a structure can inhibit formation of an interface state at an interface with a surface of the channel formation region in the semiconductor layer 202. Thus, a change in the electrical characteristics of the transistor can be suppressed, which makes it possible to provide a highly reliable transistor.

Here, the thickness of the semiconductor layer 202 is preferably at least larger than that of the first oxide layer 251. The thicker the semiconductor layer 202 is, the larger the on-state current of the transistor is. The thickness of the first oxide layer 251 may be set as appropriate as long as formation of an interface state at an interface with the semiconductor layer 202 is inhibited. For example, the thickness of the semiconductor layer 202 is larger than that of the first oxide layer 251, preferably 2 times or more, further preferably 4 times or more, still further preferably 6 times or more as large as that of the first oxide layer 251.

The depth of the groove provided in the insulating layer 207 may be set as appropriate in consideration of the thicknesses of the first protective insulating layer 211, the first oxide layer 251, and the semiconductor layer 202 which have been processed. The width of the groove may be set as appropriate depending on the channel length and the channel width of the transistor 250.

The thickness of the second oxide layer 252 may be set as appropriate, in a manner similar to that of the first oxide layer 251, as long as formation of an interface state at an interface with the semiconductor layer 202 is inhibited. For example, the thickness of the second oxide layer 252 may be set smaller than or equal to that of the first oxide layer 251. The second oxide layer 252 preferably has a small thickness because the thick second oxide layer 252 might make it difficult for an electric field by the gate electrode 205 to extend to the semiconductor layer 202. Note that the thickness of the second oxide layer 252 is not limited to the above, and may be set as appropriate depending on a driving voltage of the transistor 250 in consideration of the withstanding voltage of the gate insulating layer 204.

In addition, the insulating layer 206 that releases oxygen when heated, which is described as an example in the modification example 1 in Embodiment 1, can also be used.

Figure 14C:
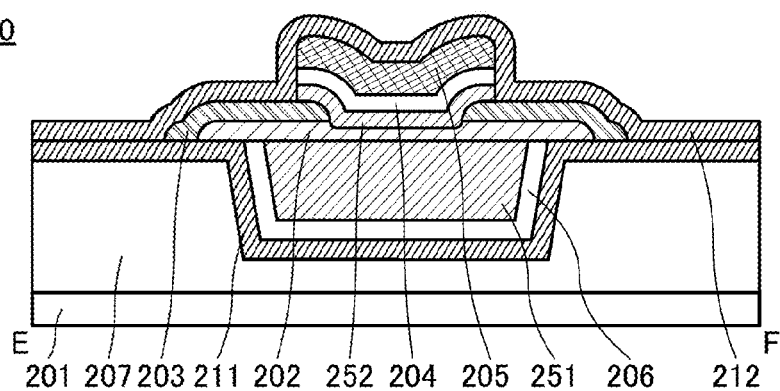
Figure 14D:
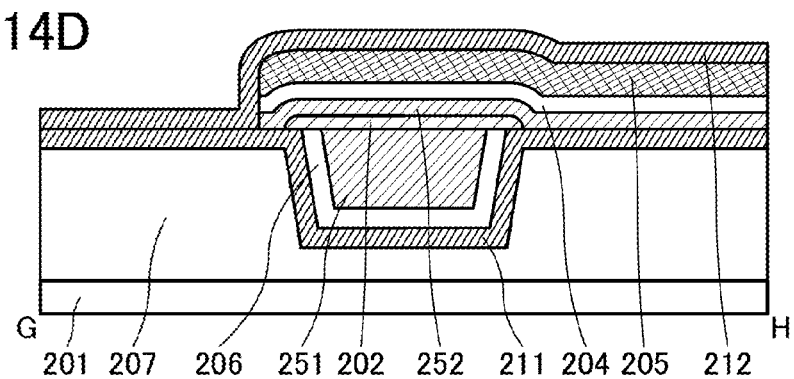

FIGS. 14C and 14D are schematic cross-sectional views of a transistor 270 with a structure different from that of the transistor 250.

The transistor 270 differs from the transistor 250 mainly in that the insulating layer 206 is provided between the first oxide layer 251 and the first protective insulating layer 211, and the semiconductor layer 202 covers a groove.

With the first oxide layer 251 provided to fill the groove, the physical distance between the semiconductor layer 202 and the insulating layer 206 can be large in the channel formation region. Thus, the number of interface states formed at an interface with the semiconductor layer 202 can be further reduced in the channel formation region.

Figure 15:
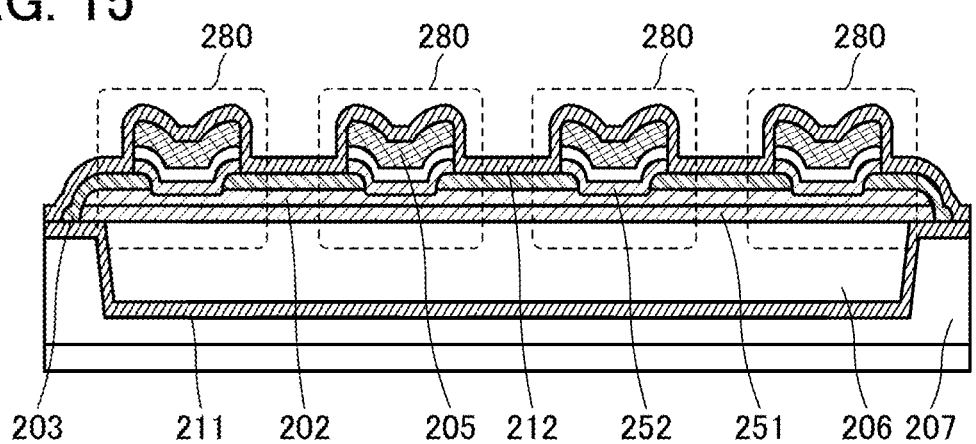
FIG. 15 illustrates a structural example of a semiconductor device of an embodiment.

FIG. 15 illustrates the case of connecting a plurality of transistors 280 with different structure from those of the transistors 250 and 270 in series. The transistor 280 differs from the transistor 270 mainly in that the first oxide layer 251 is provided to cover a groove.

The insulating layer 206 is embedded in the groove and the first oxide layer 251 and the semiconductor layer 202 are provided thereover; thus, the volume of the insulating layer 206 can be easily increased. Consequently, the amount of oxygen supplied to the semiconductor layer 202 can be increased. Furthermore, with such a structure, steps are not formed on a top surface of the insulating layer 206; therefore, the insulating layer 206 can have a large thickness without decreasing the coverage with the first oxide layer 251, the semiconductor layer 202, and the like which are formed over the insulating layer 206.

At least part of this embodiment can be implemented in combination with any of the embodiments described in this specification as appropriate.

Embodiment 3

An oxide semiconductor that can be favorably used in a semiconductor device of one embodiment of the present invention is described in this embodiment.

An oxide semiconductor has a wide energy gap of 3.0 eV or higher. A transistor using an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor using silicon.

An applicable oxide semiconductor preferably contains at least indium (In) or zinc (Zn). In particular, In and Zn are preferably contained. In addition, as a stabilizer for reducing variation in electric characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd)) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In to Ga and Zn. The In—Ga—Zn-based oxide may contain another metal element in addition to In, Ga, and Zn.

Alternatively, as the oxide semiconductor, a material represented by $InMO_3(ZnO)_m$ (m>0 is satisfied, and m is not an integer) may be used. Note that M represents one or more metal elements selected from Ga, Fe, Mn, and Co, or the above-described element as a stabilizer. Still alternatively, as the oxide semiconductor, a material represented by a chemical formula, $In_2SnO_5(ZnO)_n$ (n>0 is satisfied, and n is an integer) may be used.

For example, an In—Ga—Zn-based oxide in which an atomic ratio of In to Ga and Zn is 1:1:1, 1:3:2, 1:3:4, 1:3:6, 3:1:2, or 2:1:3, or an oxide whose composition is in the neighborhood of the above compositions may be used.

When an oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. For this reason, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment or treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of $1\times10^{17}/cm^3$ or lower, $1\times10^{16}/cm^3$ or lower, $1\times10^{15}/cm^3$ or lower, $1\times10^{14}/cm^3$ or lower, $1\times10^{13}/cm^3$ or lower.

In this manner, a transistor including an i-type or substantially i-type oxide semiconductor film can have extremely favorable off-state current characteristics. For example, the drain current at the time when the transistor including the oxide semiconductor film is in an off-state can be less than or equal to $1\times10^{-18}$ A, preferably less than or equal to $1\times10^{-21}$ A, further preferably less than or equal to $1\times10^{-24}$ A at room temperature (approximately 25° C.); or less than or equal to $1\times10^{-15}$ A, preferably less than or equal to $1\times10^{-18}$ A, further preferably less than or equal to $1\times10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1 V or more, 2 V or more, or 3 V or more.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, the CAAC-OS film is described.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

The CAAC-OS film is an oxide semiconductor film having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

FIG. 23A is a cross-sectional TEM image of a CAAC-OS film. FIG. 23B is a cross-sectional TEM image obtained by enlarging the image of FIG. 23A. In FIG. 23B, atomic arrangement is highlighted for easy understanding.

FIG. 23C is Fourier transform images of regions each surrounded by a circle (the diameter is approximately 4 nm) between A and O and between O and A' in FIG. 23A. C-axis alignment can be observed in each region in FIG. 23C. The c-axis direction between A and O is different from that between O and A', which indicates that a grain in the region between A and O is different from that between O and A'. In addition, between A and O, the angle of the c-axis continuously and gradually changes from 14.3°, 16.6° to 26.4°. Similarly, between O and A', the angle of the c-axis continuously changes from −18.3°, −17.6°, to −15.9°.

Figure 24A:
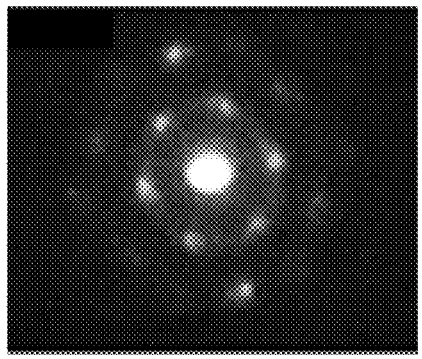
FIGS. 24A and 24B show nanobeam electron diffraction patterns of oxide semiconductor films and FIGS. 24C and 24D illustrate an example of a transmission electron diffraction measurement apparatus.

Note that in an electron diffraction pattern of the CAAC-OS film, spots (bright spots) having alignment are shown. For example, when electron diffraction with an electron beam having a diameter of 1 nm or greater and 30 nm or less (such electron diffraction is also referred to as nanobeam electron diffraction) is performed on the top surface of the CAAC-OS film, spots are observed (see FIG. 24A).

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Furthermore, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, in the CAAC- OS film to which an impurity is added, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has a higher strength of binding to oxygen than that of a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Charge trapped by the carrier traps in the oxide semiconductor film takes a long time to be released, and might behave like fixed charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, the microcrystalline oxide semiconductor film is described.

In an image obtained with the TEM, crystal parts cannot be found clearly in the microcrystalline oxide semiconductor film in some cases. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc).

An oxide semiconductor film including nanocrystal is referred to as an nc-OS (nanocrystalline oxide semiconductor) film. In an image obtained with TEM, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film which is obtained by using an electron beam having a probe diameter (e.g., greater than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 24B:
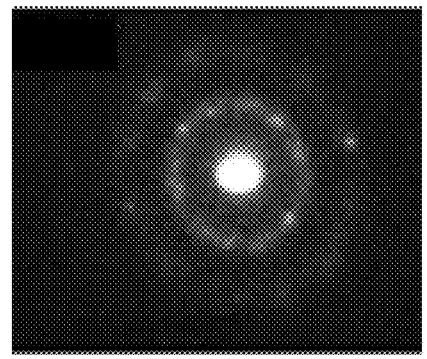
Figure 24C:
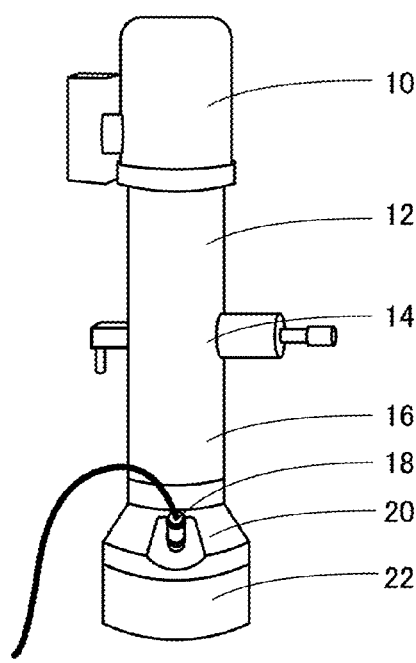

FIG. 24C illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face toward the inside of the observation chamber 20. Note that the film chamber 22 is not necessarily provided.

Figure 24D:
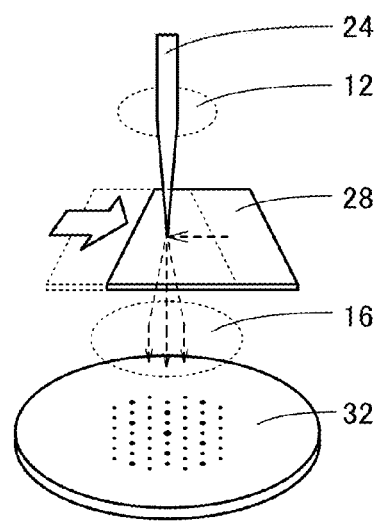

FIG. 24D illustrates an internal structure of the transmission electron diffraction measurement apparatus illustrated in FIG. 24C. In the transmission electron diffraction measurement apparatus, a substance 28 which is positioned in the sample chamber 14 is irradiated with electrons emitted from an electron gun installed in the electron gun chamber 10 through the optical system 12. Electrons passing through the substance 28 enter a fluorescent plate 32 provided in the observation chamber 20 through the optical system 16. A pattern which depends on the intensity of the incident electrons appears in the fluorescent plate 32, so that the transmitted electron diffraction pattern can be measured.

The camera 18 is installed so as to face the fluorescent plate 32 and can take a picture of a pattern appearing in the fluorescent plate 32. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24. In this case, a transmission electron diffraction pattern with less distortion can be taken from the rear surface of the fluorescent plate 32.

A holder for fixing the substance 28 that is a sample is provided in the sample chamber 14. The holder transmits electrons passing through the substance 28. The holder may have, for example, a function of moving the substance 28 in the direction of the X, Y, and Z axes. The movement function of the holder may have an accuracy of moving the substance within the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 28.

Then, a method for measuring a transmission electron diffraction pattern of a substance by the transmission electron diffraction measurement apparatus described above is described.

For example, changes in the structure of a substance can be observed by changing (scanning) the irradiation position of the electrons 24 that are a nanobeam in the substance, as illustrated in FIG. 24D. At this time, when the substance 28 is a CAAC-OS film, a diffraction pattern shown in FIG. 24A can be observed. When the substance 28 is an nc-OS film, a diffraction pattern shown in FIG. 24B can be observed.

Even when the substance 28 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 25A:
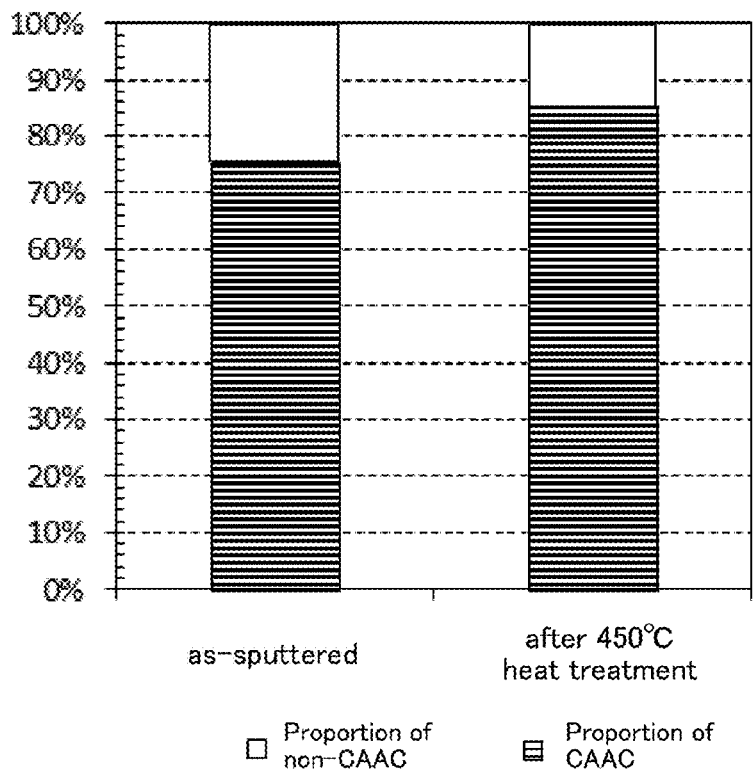
FIG. 25A shows an example of structural analysis by transmission electron diffraction measurement and FIGS. 25B and 25C show planar TEM images.

FIG. 25A shows the proportion of CAAC of the samples. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Further, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 25B:
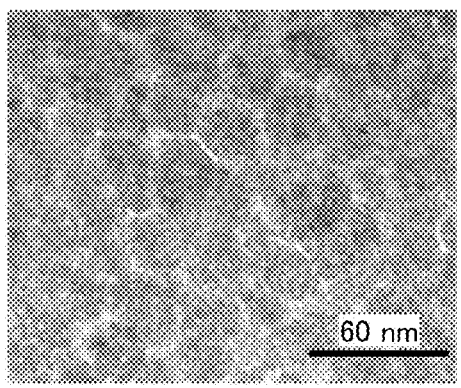
Figure 25C:
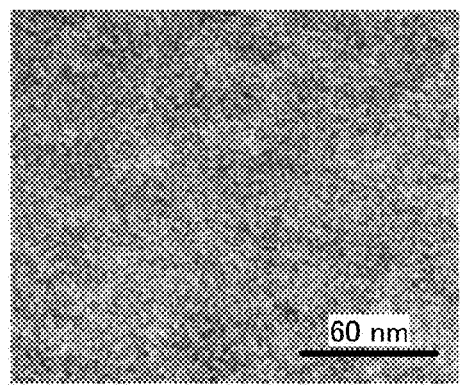

FIGS. 25B and 25C are planar TEM images of the CAAC-OS film obtained just after the deposition and the CAAC-OS film subjected to the heat treatment at 450° C., respectively. Comparison between FIGS. 25B and 25C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Embodiment 4

In this embodiment, an example of a circuit including the transistor of one embodiment of the present invention is described with reference to the drawings.

Figure 16A:
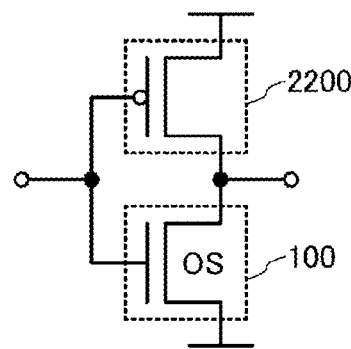
FIGS. 16A to 16D illustrate structural examples and circuit diagrams of a semiconductor device of an embodiment.
Figure 16B:
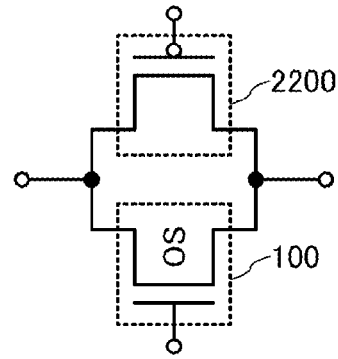
Figure 16C:
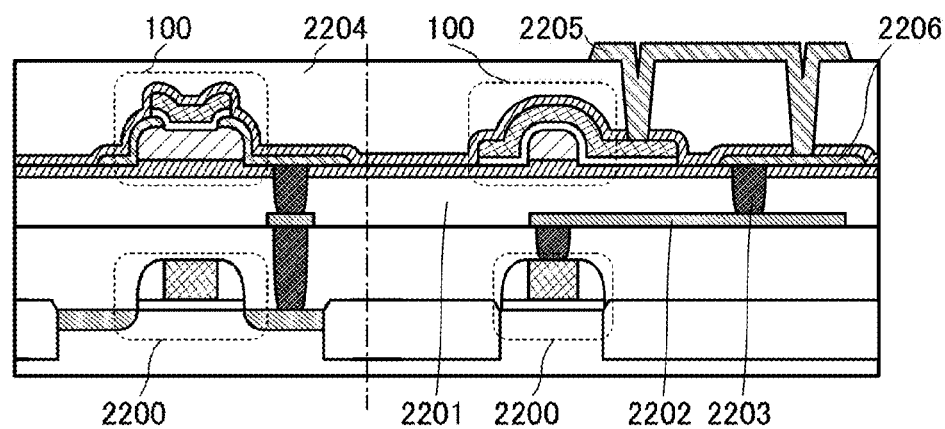
Figure 16D:
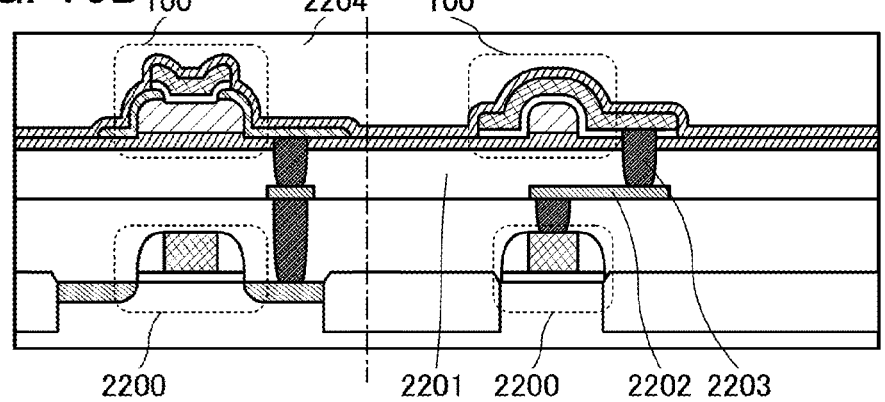

FIG. 16A is a circuit diagram of a semiconductor device and FIGS. 16C and 16D are each a cross-sectional view of a semiconductor device. FIGS. 16C and 16D each illustrate a cross-sectional view of the transistor 100 in a channel length direction on the left and a cross-sectional view of the transistor 100 in a channel width direction on the right. In the circuit diagram, "OS" is written beside a transistor in order to clearly demonstrate that the transistor uses an oxide semiconductor.

The semiconductor devices illustrated in FIGS. 16C and 16D each include a transistor 2200 using a first semiconductor material in a lower portion and a transistor using a second semiconductor material in an upper portion. Here, an example is described in which the transistor 100 described in Embodiment 1 as an example is used as the transistor using the second semiconductor material.

Figure 17A:
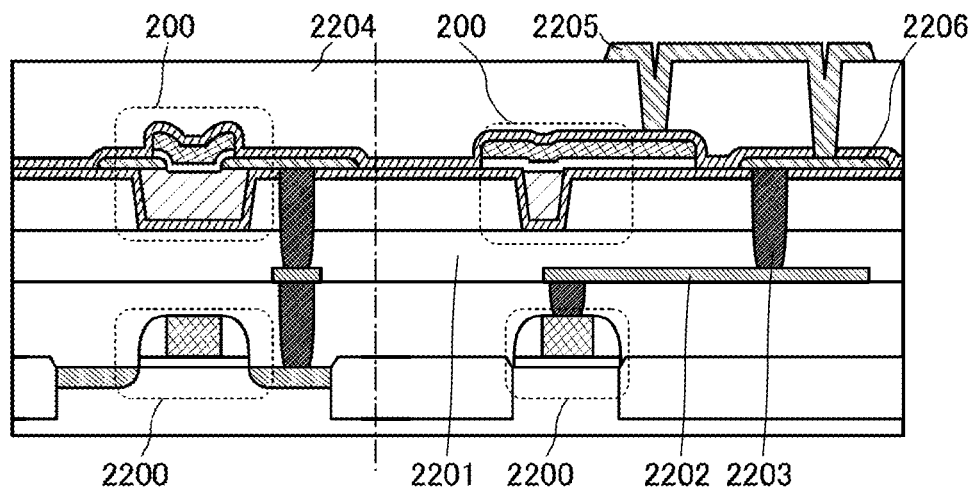
FIGS. 17A and 17B illustrate structural examples of a semiconductor device of an embodiment.
Figure 17B:
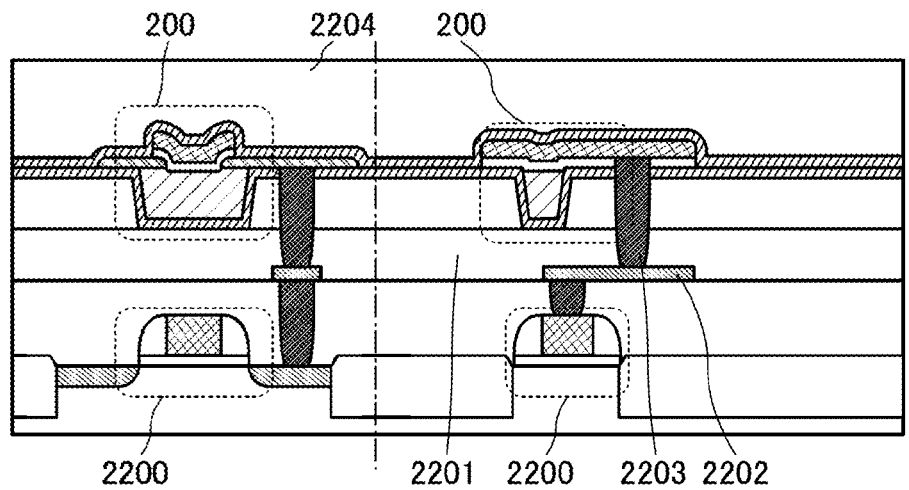

Note that FIGS. 17A and 17B illustrate examples of cross sections in the case where the transistor 200 described in Embodiment 1 is used as the transistor using the second semiconductor material.

Here, the first semiconductor material and the second semiconductor material are preferably materials having different band gaps. For example, a semiconductor material other than an oxide semiconductor (e.g., silicon, germanium, silicon germanium, silicon carbide, or gallium arsenide) can be used as the first semiconductor material, and the oxide semiconductor described in Embodiment 1 can be used as the second semiconductor material. A transistor using a material other than an oxide semiconductor, such as single crystal silicon, can operate at high speed easily. On the other hand, a transistor using an oxide semiconductor has low off-state current.

Although the transistor 2200 is a p-channel transistor here, it is needless to say that an n-channel transistor can be used to form a circuit having a different configuration. The specific structure of the semiconductor device, such as a material used for the semiconductor device and the structure of the semiconductor device, needs not to be limited to that described here except for the use of the transistor described in Embodiment 1, which is formed using an oxide semiconductor.

FIGS. 16A, 16C, and 16D each illustrate a configuration example of what is called a CMOS circuit, in which a p-channel transistor and an n-channel transistor are connected in series and gates of the transistors are connected.

The circuit can operate at high speed because the transistor of one embodiment of the present invention that uses an oxide semiconductor has high on-state current.

FIG. 16C illustrates a configuration in which the transistor 100 is provided over the transistor 2200 with an insulating layer 2201 provided therebetween. A plurality of wirings 2202 are provided between the transistor 2200 and the transistor 100. Furthermore, wirings and electrodes provided over and under the insulating layers are electrically connected to each other through a plurality of plugs 2203 embedded in the insulating layers. Note that an insulating layer 2204 covering the transistor 100, a wiring 2205 over the insulating layer 2204, and a wiring 2206 formed by processing a conductive film that is also used for the pair of electrodes of the transistor are provided.

When two transistors are stacked as described above, the area occupied by the circuit can be reduced and a plurality of circuits can be arranged with higher density.

In FIG. 16C, one of a source and a drain of the transistor 100 is electrically connected to one of a source and a drain of the transistor 2200 through the wirings 2202 and the plugs 2203. The gate of the transistor 100 is electrically connected to the gate of the transistor 2200 through the wiring 2205, the wiring 2206, the plugs 2203, the wiring 2202, and the like.

In the configuration illustrated in FIG. 16D, an opening portion in which the plug 2203 is embedded is provided in the gate insulating layer of the transistor 100, and the gate of the transistor 100 is in contact with the plug 2203. With such a configuration, the integration of the circuit can be easily achieved and the lengths and the number of wirings and plugs can be made smaller than those in the configuration illustrated in FIG. 16C; thus, the circuit can operate at higher speed.

Note that when a connection between the electrodes of the transistor 100 and the transistor 2200 is changed from that in the configuration illustrated in FIG. 16C or FIG. 16D, a variety of circuits can be formed. For example, a circuit having a configuration in which a source and a drain of a transistor are connected to those of another transistor as illustrated in FIG. 16B can operate as what is called an analog switch.

In addition, a semiconductor device having an image sensor function for reading data of an object can be manufactured with the use of any of the transistors described in Embodiment 1 or 2.

Figure 18:
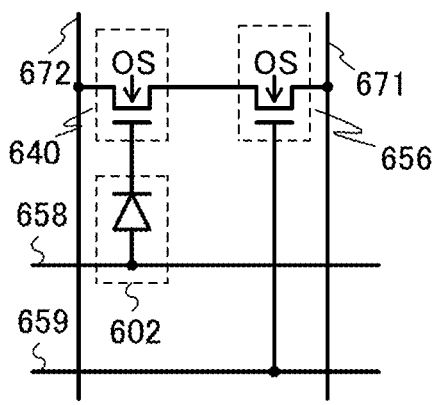
FIG. 18 is an equivalent circuit diagram of a semiconductor device of an embodiment.

FIG. 18 illustrates an example of an equivalent circuit of a semiconductor device having an image sensor function.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photosensor output signal line 671.

As the photodiode 602, for example, a pin photodiode in which a semiconductor layer having p-type conductivity, a high-resistance semiconductor layer (semiconductor layer having i-type conductivity), and a semiconductor layer having n-type conductivity are stacked can be used.

With detection of light that enters the photodiode 602, data of an object can be read. Note that a light source such as a backlight can be used at the time of reading data of an object.

Note that as each of the transistor 640 and the transistor 656, any of the transistors described as examples in Embodiment 1 or 2 in which a channel is formed in an oxide semiconductor can be used. In FIG. 18, "OS" is written beside each of the transistor 640 and the transistor 656 so that it can be clearly identified that the transistors include an oxide semiconductor.

The transistor 640 and the transistor 656 are any of the transistors described as examples in the above embodiments, in which an oxide semiconductor layer including a channel is wrapped with insulating layers each including an aluminum oxide film that contains excess oxygen. Furthermore, the transistor 640 and the transistor 656 preferably have a structure in which the oxide semiconductor layer is electrically surrounded by the gate electrode. The transistor 640 and the transistor 656 are electrically stable transistors with less change in electrical characteristics. With the transistor, the semiconductor device having an image sensor function, which is illustrated in FIG. 18, can be highly reliable.

This embodiment can be implemented in combination with any of the other embodiments described in this specification as appropriate.

Embodiment 5

In this embodiment, an example of a semiconductor device (memory device) which uses a transistor of one embodiment of the present invention, which can hold stored data even when not powered, and which has an unlimited number of write cycles is described with reference to drawings.

Figure 19:
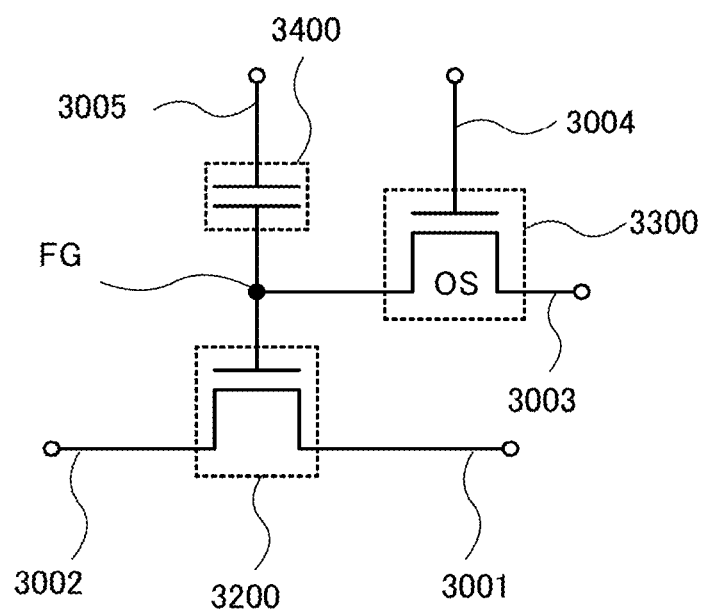
FIG. 19 is a circuit diagram of a semiconductor device of an embodiment.

FIG. 19 illustrates a circuit diagram of the semiconductor device.

The semiconductor device illustrated in FIG. 19 includes a transistor 3200 using a first semiconductor material, a transistor 3300 using a second semiconductor material, and a capacitor 3400. Note that as the transistor 3300, any of the transistors described in the above embodiments can be used.

The transistor 3300 is a transistor in which a channel is formed in a semiconductor layer including an oxide semiconductor. Since the off-state current of the transistor 3300 is small, stored data can be retained for a long period owing to such a transistor. In other words, power consumption can be sufficiently reduced because a semiconductor memory device in which refresh operation is unnecessary or the frequency of refresh operation is extremely low can be provided.

In FIG. 19, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 19 utilizes a feature that the potential of the gate electrode of the transistor 3200 can be held, and thus enables writing, storing, and reading of data as follows.

Writing and holding of data are described. First, the potential of the fourth wiring 3004 is set to a potential at which the transistor 3300 is turned on, so that the transistor 3300 is turned on. Accordingly, the potential of the third wiring 3003 is applied to the gate electrode of the transistor 3200 and the capacitor 3400. That is, predetermined charge is given to the gate electrode of the transistor 3200 (writing). Here, charge for providing either of two different potential levels (hereinafter referred to as low-level charge and high-level charge) is applied. Then, the potential of the fourth wiring 3004 is set to a potential at which the transistor 3300 is turned off, so that the transistor 3300 is turned off. Thus, the charge given to the gate electrode of the transistor 3200 is held (holding).

Since the off-state current of the transistor 3300 is extremely small, the charge of the gate electrode of the transistor 3200 is held for a long time.

Next, reading of data is described. By applying an appropriate potential (a reading potential) to the fifth wiring 3005 while applying a predetermined potential (a constant potential) to the first wiring 3001, the potential of the second wiring 3002 varies depending on the amount of charge held in the gate electrode of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge given to the gate electrode of the transistor 3200 can be determined. For example, in the case where the high-level charge is given in writing, when the potential of the fifth wiring 3005 is $V_0$ ($>V_{th\_H}$), the transistor 3200 is turned on. In the case where the low-level charge is given in writing, even when the potential of the fifth wiring 3005 is $V_0$ ($<V_{th\_L}$), the transistor 3200 remains off. Therefore, the data held in the gate electrode can be read by determining the potential of the second wiring 3002.

Note that in the case where memory cells are arrayed to be used, only data of desired memory cells needs to be read. In the case where such reading is not performed, a potential at which the transistor 3200 is off regardless of the state of the gate electrode, that is, a potential smaller than $V_{th\_H}$ may be applied to the fifth wiring 3005. Alternatively, a potential at which the transistor 3200 is on regardless of the state of the gate electrode, that is, a potential larger than $V_{th\_L}$ may be applied to the fifth wiring 3005.

With the use of a transistor which includes a channel formation region formed using an oxide semiconductor and has extremely small off-state current, the semiconductor device in this embodiment can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Furthermore, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not arise. In other words, the semiconductor device of one embodiment of the present invention does not have a limit on the number of times of writing which is a problem in the conventional nonvolatile memory, and reliability thereof is drastically improved. Moreover, data is written depending on the on state and the off state of the transistor, whereby high-speed operation can be easily achieved.

This embodiment can be combined with any of the other embodiments disclosed in this specification as appropriate.

Embodiment 6

In this embodiment, description is given of a CPU in which at least the transistor described in any of the above embodiments can be used and the memory device described in Embodiment 5 is included.

Figure 20:
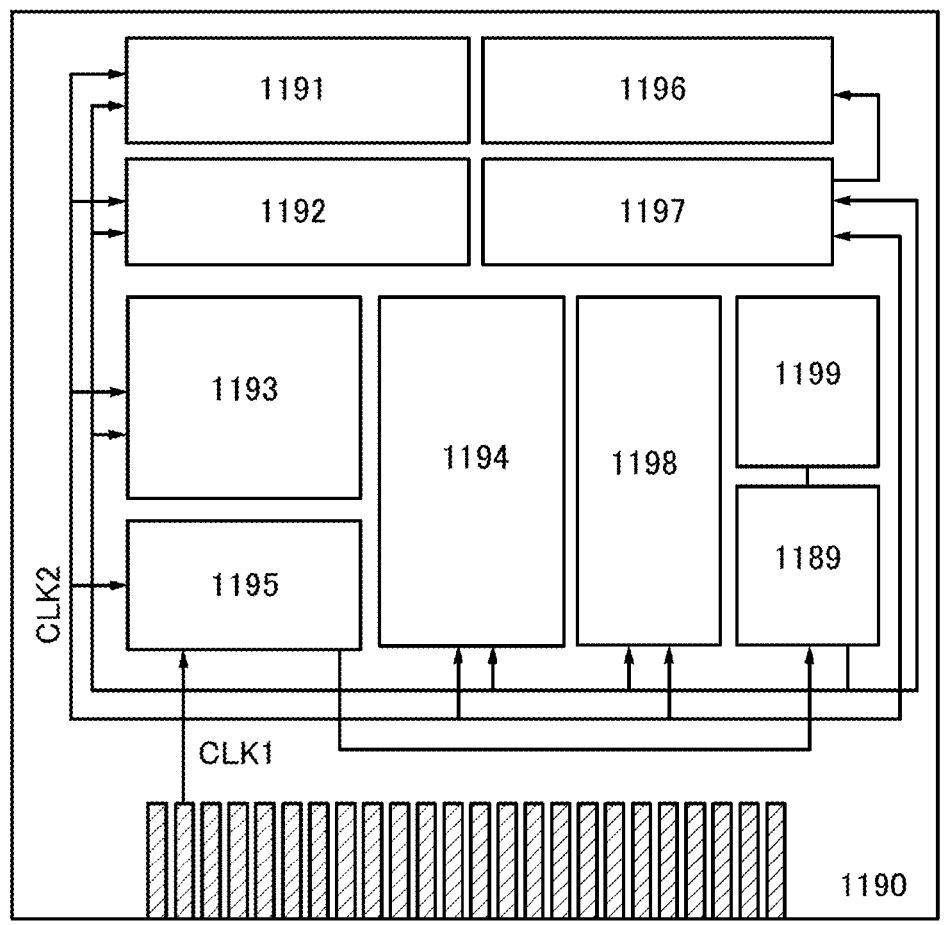
FIG. 20 is a block diagram of a semiconductor device of an embodiment.

FIG. 20 is a block diagram illustrating an example of the configuration of a CPU at least partly including any of the transistors described in Embodiment 1.

The CPU illustrated in FIG. 20 includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 20 is just an example of a simplified configuration, and an actual CPU may have a variety of configurations depending on the application. For example, the CPU may have a configuration including a plurality of cores that operate in parallel; each of the cores has a structure including the CPU or the arithmetic circuit illustrated in FIG. 20. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 20, a memory cell is provided in the register 1196. For the memory cell of the register 1196, any of the transistors described in the above embodiments can be used.

In the CPU in FIG. 20, the register controller 1197 selects an operation of holding data in the register 1196, in response to an instruction from the ALU 1191. That is, the register controller 1197 selects whether data is held by a flip-flop or by a capacitor in the memory cell included in the register 1196. When data holding by the flip-flop is selected, power supply voltage is supplied to the memory cell in the register 1196. When data holding by the capacitor is selected, the data is rewritten in the capacitor, and supply of power supply voltage to the memory cell in the register 1196 can be stopped.

Figure 21:
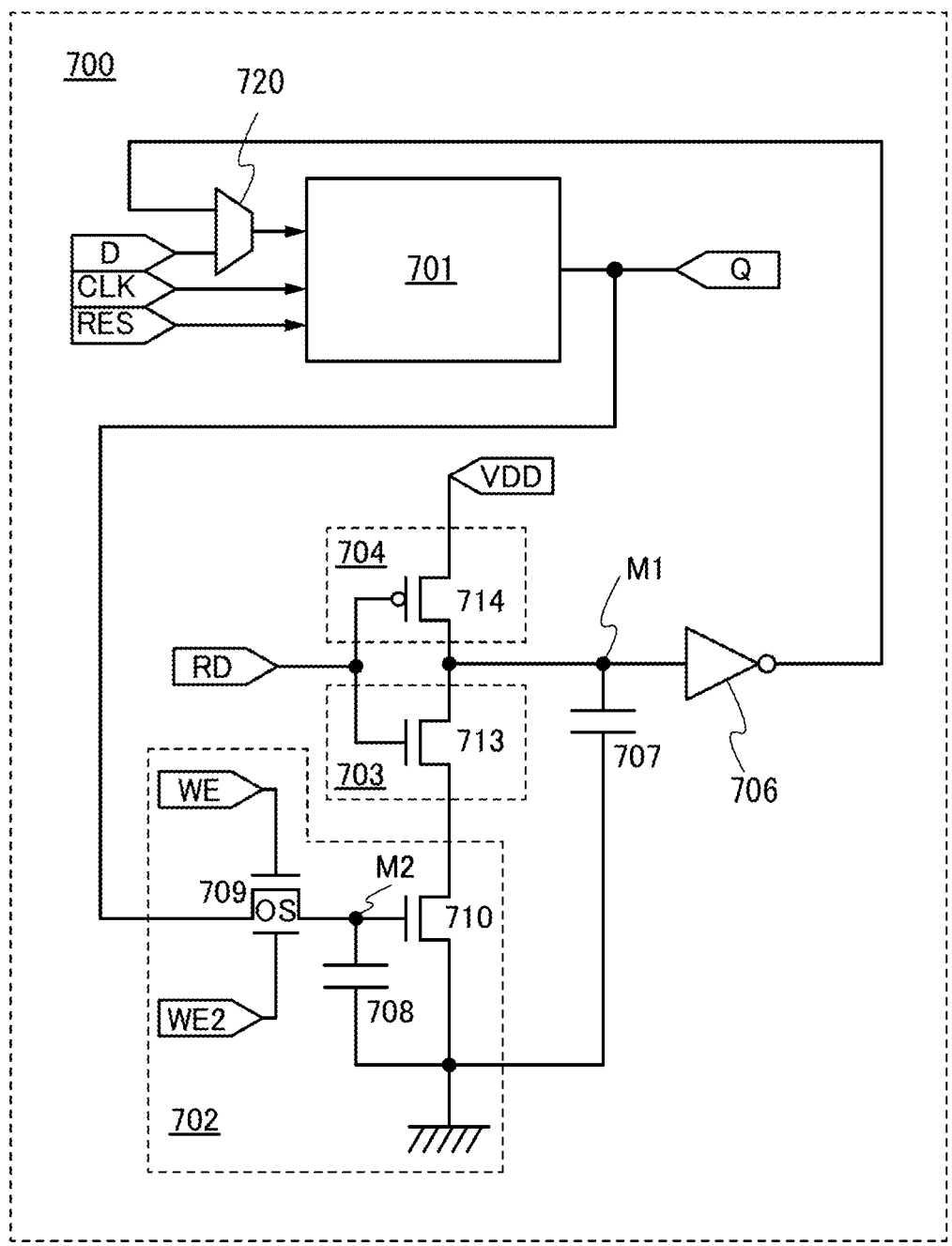
FIG. 21 is a circuit diagram of a memory device of an embodiment.

FIG. 21 is an example of a circuit diagram of a memory element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the memory device described in Embodiment 5 can be used as the circuit 702. When supply of the power supply voltage to the memory element 700 is stopped, a ground potential (0 V) or a potential at which the transistor 709 is turned off continues to be input to a gate of the transistor 709 in the circuit 702. For example, the gate of the transistor 709 is grounded through a load such as a resistor.

An example in which the switch 703 is a transistor 713 having one conductivity type (e.g., an n-channel transistor) and the switch 704 is a transistor 714 having a conductivity type opposite to the one conductivity type (e.g., a p-channel transistor) is described. Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 708 can be supplied with a low power supply potential (e.g., GND) or a high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to a first gate (first gate electrode) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the circuit 701 is input to the other of the source and the drain of the transistor 709. FIG. 21 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 21, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is held is provided in the circuit 701, the signal output from the second terminal of the switch 703 (the other of the source and the drain of the transistor 713) can be input to the node.

As the transistor 709 in FIG. 21, any of the transistors described in Embodiment 1 can be used. The transistor 709 preferably includes a second gate (second gate electrode) that faces the first gate with a semiconductor layer provided therebetween. The control signal WE can be input to the first gate and the control signal WE2 can be input to the second gate. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and the cut-off current (Icut) of the transistor 709 can be further reduced. Note that as the transistor 709, the transistor without the second gate can be used.

Furthermore, in FIG. 21, the transistors included in the memory element 700 except for the transistor 709 can each be a transistor in which a channel is formed in a layer formed using a semiconductor other than an oxide semiconductor or in the substrate 1190. For example, the transistor can be a transistor in which a channel is formed in a silicon layer or a silicon substrate. Alternatively, a transistor in which a channel is formed in an oxide semiconductor layer can be used for all the transistors used for the memory element 700. Further alternatively, in the memory element 700, a transistor in which a channel is formed in an oxide semiconductor layer can be included besides the transistor 709, and a transistor in which a channel is formed in a layer or the substrate 1190 including a semiconductor other than an oxide semiconductor can be used for the rest of the transistors.

As the circuit 701 in FIG. 21, for example, a flip-flop circuit can be used. As the logic element 706, for example, an inverter, a clocked inverter, or the like can be used.

In the semiconductor device of one embodiment of the present invention, in a period during which the memory element 700 is not supplied with the power supply voltage, data stored in the circuit 701 can be held by the capacitor 708 which is provided in the circuit 702.

The off-state current of a transistor in which a channel is formed in an oxide semiconductor layer is extremely low. For example, the off-state current of a transistor whose channel is formed in an oxide semiconductor layer is much lower than that of a transistor whose channel is formed in crystalline silicon. Thus, when such a transistor including an oxide semiconductor is used for the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

Since the switch 703 and the switch 704 are provided, the memory element performs pre-charge operation; thus, the time required for the circuit 701 to hold original data again after the supply of the power supply voltage is restarted can be shortened.

In the circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the circuit 702. Consequently, an original signal can be accurately read even when a potential corresponding to the signal held by the capacitor 708 fluctuates to some degree.

By using the above-described memory element 700 in a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be reduced.

Although an example in which the memory element 700 is used in a CPU is described in this embodiment, the memory element 700 can also be used in a digital signal processor (DSP), a custom LSI, an LSI such as a programmable logic device (PLD), and a radio frequency identification (RF-ID).

This embodiment can be combined with any of the other embodiments disclosed in this specification as appropriate.

Embodiment 7

In this embodiment, description is given of examples of an electronic device which can include any of the semiconductor devices described in the above embodiments, such as the transistors, the memory device, and the CPU (including a DSP, a custom LSI, a PLD, and an RF-ID).

Any of the transistors, the memory device, and the CPU described in the above embodiments can be used in a variety of electronic devices (including game machines). Examples of the electronic devices include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers and X-ray diagnostic equipment. The examples of the electronic devices further include alarm devices such as smoke detectors, heat detectors, gas alarm devices, and security alarm devices. In addition, industrial equipment such as guide lights, traffic lights, belt conveyors, elevators, escalators, industrial robots, and power storage systems can be included in the examples. Furthermore, moving objects and the like driven by fuel engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Some specific examples of these electronic devices are illustrated in FIGS. 22A to 22C.

Figure 22A:
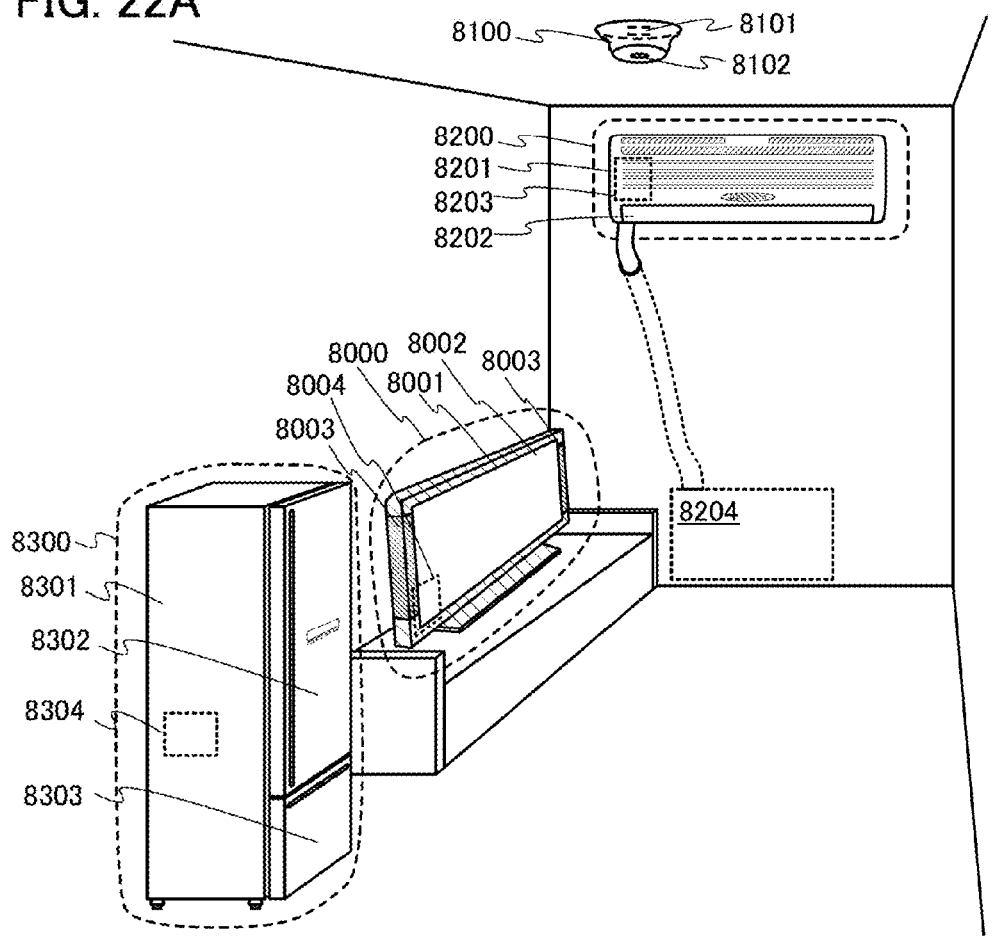
FIGS. 22A to 22C illustrate electronic devices of an embodiment.
Figure 22B:
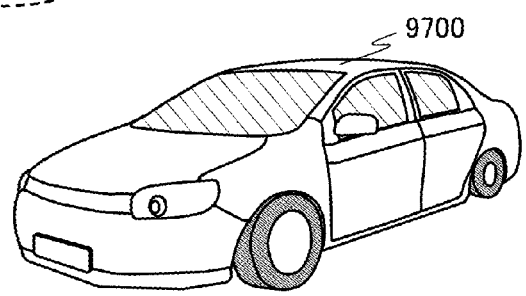
Figure 22C:
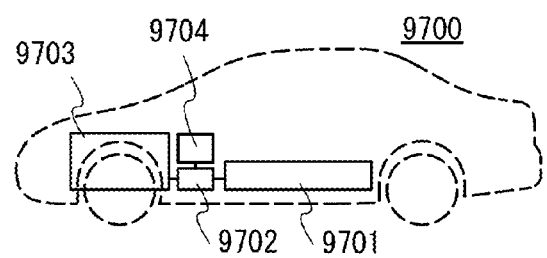

In a television set 8000 illustrated in FIG. 22A, a display portion 8002 is incorporated in a housing 8001. The display portion 8002 can display an image and a speaker portion 8003 can output sound. Any of the transistors described in the above embodiments can be used in a pixel or a driver circuit for operating the display portion 8002 incorporated in the housing 8001.

A semiconductor display device such as a liquid crystal display device, a light-emitting device in which a light-emitting element such as an organic EL element is provided in each pixel, an electrophoretic display device, a digital micromirror device (DMD), or a plasma display panel (PDP) can be used for the display portion 8002.

The television set 8000 may be provided with a receiver, a modem, and the like. With the receiver, a general television broadcast can be received. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU 8004 for performing information communication or a memory. Any of the transistors, the memory device, and the CPU described in the above embodiments is used for the CPU 8004 or the memory, whereby power consumption can be reduced.

An alarm device 8100 illustrated in FIG. 22A is a residential fire alarm, which is an example of an electronic device including a sensor portion 8102 for smoke or heat and a microcomputer 8101. The microcomputer 8101 includes any of the transistors, the memory device, and the CPU described in the above embodiments.

An air conditioner which includes an indoor unit 8200 and an outdoor unit 8204 illustrated in FIG. 22A is an example of an electronic device including any of the transistors, the memory device, the CPU, and the like described in the above embodiments. Specifically, the indoor unit 8200 includes a housing 8201, an air outlet 8202, a CPU 8203, and the like. Although the CPU 8203 is provided in the indoor unit 8200 in FIG. 22A, the CPU 8203 may be provided in the outdoor unit 8204. Alternatively, the CPU 8203 may be provided in both the indoor unit 8200 and the outdoor unit 8204. Any of the transistors described in the above embodiments is used in the CPU in the air conditioner, whereby power consumption can be reduced.

An electronic refrigerator-freezer 8300 illustrated in FIG. 22A is an example of an electronic device including any of the transistors, the memory device, the CPU, and the like described in the above embodiments. Specifically, the electric refrigerator-freezer 8300 includes a housing 8301, a door for a refrigerator 8302, a door for a freezer 8303, a CPU 8304, and the like. In FIG. 22A, the CPU 8304 is provided in the housing 8301. Any of the transistors described in the above embodiments is used in the CPU 8304 of the electric refrigerator-freezer 8300, whereby power consumption can be reduced.

FIGS. 22B and 22C illustrate an example of an electric vehicle which is an example of an electronic device. An electric vehicle 9700 is equipped with a secondary battery 9701. The output of the electric power of the secondary battery 9701 is adjusted by a circuit 9702 and the electric power is supplied to a driving device 9703. The circuit 9702 is controlled by a processing unit 9704 including a ROM, a RAM, a CPU, or the like which is not illustrated. Any of the transistors described in the above embodiments is used in the CPU in the electric vehicle 9700, whereby power consumption can be reduced.

The driving device 9703 includes a DC motor or an AC motor either alone or in combination with an internal-combustion engine. The processing unit 9704 outputs a control signal to the circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be combined with any of the other embodiments disclosed in this specification as appropriate.

This application is based on Japanese Patent Application serial no. 2013-106223 filed with Japan Patent Office on May 20, 2013 and Japanese Patent Application serial no. 2013-106253 filed with Japan Patent Office on May 20, 2013, the entire contents of which are hereby incorporated by reference.

What is claimed is:

1. A semiconductor device comprising:
   a first insulating layer comprising aluminum oxide;
   an oxide semiconductor layer over the first insulating layer;
   a source electrode and a drain electrode that are electrically connected to the oxide semiconductor layer;
   a gate insulating layer that is over the source electrode and the drain electrode and overlaps with the oxide semiconductor layer;
   a gate electrode that overlaps with the oxide semiconductor layer with the gate insulating layer provided therebetween; and
   a second insulating layer comprising aluminum oxide that covers the source electrode, the drain electrode, and the gate electrode,
   wherein the first insulating layer and the second insulating layer each include an oxygen-excess region, and
   wherein the first insulating layer and the second insulating layer are in contact with each other in a region where the source electrode, the drain electrode, and the gate electrode are not provided.

2. The semiconductor device according to claim 1,
   wherein the gate electrode covers a top surface and a side surface of the oxide semiconductor layer with the gate insulating layer provided therebetween.

3. The semiconductor device according to claim 1,
   wherein a thickness of the oxide semiconductor layer is 0.1 times or more and 10 times or less as large as a channel width.

4. The semiconductor device according to claim 1, further comprising:
   a first oxide layer between the first insulating layer and the oxide semiconductor layer, the first oxide layer comprising at least one metal element contained in the oxide semiconductor layer; and
   a second oxide layer between the oxide semiconductor layer and the gate insulating layer, the second oxide layer comprising at least one metal element contained in the oxide semiconductor layer,
   wherein a conduction band minimum of the first oxide layer and a conduction band minimum of the second oxide layer are each closer to a vacuum level than a conduction band minimum of the oxide semiconductor layer,
   wherein a difference between energy at the conduction band minimum of the first oxide layer and energy at the conduction band minimum of the oxide semiconductor layer is 0.05 eV or higher and 2 eV or lower, and
   wherein a difference between energy at the conduction band minimum of the second oxide layer and the energy at the conduction band minimum of the oxide semiconductor layer is 0.05 eV or higher and 2 eV or lower.

5. The semiconductor device according to claim 4,
   wherein a top surface of the second oxide layer is in contact with an undersurface of the source electrode, an undersurface of the drain electrode, and an undersurface of the gate insulating layer.

6. The semiconductor device according to claim 4,
   wherein an undersurface of the second oxide layer is in contact with a top surface of the source electrode, a top surface of the drain electrode, and a top surface and a side surface of the oxide semiconductor layer in a region where the source electrode and the drain electrode are not provided.

7. The semiconductor device according to claim 1, wherein a thickness of the oxide semiconductor layer where the source electrode and the drain electrode do not overlap is smaller than a thickness of the oxide semiconductor layer where the source electrode or the drain electrode overlaps.

8. The semiconductor device according to claim 1, further comprising a third insulating layer between the first insulating layer and the oxide semiconductor layer.

9. The semiconductor device according to claim 1, wherein the oxide semiconductor layer comprises crystal.

10. The semiconductor device according to claim 9, wherein a c-axis of the crystal is substantially perpendicular to a surface where the oxide semiconductor layer is formed or a surface of the oxide semiconductor layer.

11. A semiconductor device comprising:
a first insulating layer including a groove;
a second insulating layer comprising aluminum oxide that covers a side surface and a bottom surface of the groove;
an oxide semiconductor layer that is over the second insulating layer and fills the groove;
a source electrode and a drain electrode that are electrically connected to the oxide semiconductor layer;
a gate insulating layer that is over the source electrode and the drain electrode and overlaps with the oxide semiconductor layer;
a gate electrode that overlaps with the oxide semiconductor layer with the gate insulating layer provided therebetween; and
a third insulating layer comprising aluminum oxide that covers the source electrode, the drain electrode, and the gate electrode,
wherein the second insulating layer and the third insulating layer each include an oxygen-excess region, and
wherein the second insulating layer and the third insulating layer are in contact with each other in a region where the source electrode, the drain electrode, and the gate electrode are not provided.

12. The semiconductor device according to claim 11, further comprising:

a first oxide layer between the second insulating layer and the oxide semiconductor layer, the first oxide layer comprising at least one metal element contained in the oxide semiconductor layer; and a second oxide layer between the oxide semiconductor layer and the gate insulating layer, the second oxide layer comprising at least one metal element contained in the oxide semiconductor layer, wherein a conduction band minimum of the first oxide layer and a conduction band minimum of the second oxide layer are each closer to a vacuum level than a conduction band minimum of the oxide semiconductor layer, wherein a difference between energy at the conduction band minimum of the first oxide layer and energy at the conduction band minimum of the oxide semiconductor layer is 0.05 eV or higher and 2 eV or lower, and wherein a difference between energy at the conduction band minimum of the second oxide layer and the energy at the conduction band minimum of the oxide semiconductor layer is 0.05 eV or higher and 2 eV or lower.

13. The semiconductor device according to claim 12, wherein an undersurface of the second oxide layer is in contact with a top surface of the source electrode, a top surface of the drain electrode, and a top surface of the oxide semiconductor layer in a region where the source electrode and the drain electrode are not provided.

14. The semiconductor device according to claim 11, wherein a thickness of the oxide semiconductor layer where the source electrode and the drain electrode do not overlap is smaller than a thickness of the oxide semiconductor layer where the source electrode or the drain electrode overlaps.

15. The semiconductor device according to claim 11, further comprising a fourth insulating layer between the second insulating layer and the oxide semiconductor layer.

16. The semiconductor device according to claim 11, wherein the oxide semiconductor layer comprises crystal.

17. The semiconductor device according to claim 16, wherein a c-axis of the crystal is substantially perpendicular to a surface where the oxide semiconductor layer is formed or a surface of the oxide semiconductor layer.

* * * * *